US012725999B2

(12) United States Patent
Takeda et al.

(10) Patent No.: US 12,725,999 B2
(45) Date of Patent: Sep. 1, 2026

(54) LASER LIGHT SOURCE AND METHOD OF MANUFACTURING THE SAME

(71) Applicants: NICHIA CORPORATION, Anan (JP); FURUKAWA ELECTRIC CO., LTD., Tokyo (JP)

(72) Inventors: Hideaki Takeda, Kawasaki (JP); Norihiro Dejima, Yokohama (JP); Kazuma Kozuru, Anan (JP); Toshiaki Yamashita, Komatsushima (JP); Akira Yukumoto, Yokohama (JP)

(73) Assignees: NICHIA CORPORATION;, Anan (JP); FURUKAWA ELECTRIC CO., LTD., Tokyo (JP)

( * ) Notice: Subject to any disclaimer, the term of this patent is extended or adjusted under 35 U.S.C. 154(b) by 685 days.

(21) Appl. No.: 18/190,727

(22) Filed: Mar. 27, 2023

(65) Prior Publication Data

US 2023/0318256 A1 Oct. 5, 2023

(30) Foreign Application Priority Data

Mar. 29, 2022 (JP) ................................ 2022-053023

(51) Int. Cl.
*H01S 5/02253* (2021.01)
*H01S 5/02326* (2021.01)
*H01S 5/0236* (2021.01)

(52) U.S. Cl.
CPC ...... *H01S 5/02253* (2021.01); *H01S 5/02326* (2021.01); *H01S 5/0236* (2021.01)

(58) Field of Classification Search
None
See application file for complete search history.

(56) References Cited

U.S. PATENT DOCUMENTS 6,078,437 A 6/2000 Kwiatkowski
2001/0043779 A1 11/2001 Lissotschenko et al.
2003/0048819 A1 * 3/2003 Nagano ................ H01S 5/0233 372/36
2004/0151228 A1 8/2004 Fuse
(Continued)

FOREIGN PATENT DOCUMENTS

JP S62-035542 A 2/1987
JP H06-196816 A 7/1994
(Continued)

*Primary Examiner* — Michael Carter
(74) *Attorney, Agent, or Firm* — Foley & Lardner LLP

(57) ABSTRACT

A laser light source includes: a submount; a semiconductor laser element fixed to the submount, the semiconductor laser element having a light-exiting surface through which laser light is to be emitted; a lens member having a light incident surface on which the laser light is incident and a bonding surface that extends laterally from the light incident surface; a supporting member connecting the lens member and the submount together so that the light incident surface of the lens member faces the light-exiting surface of the semiconductor laser element; and an inorganic bonding layer bonding the bonding surface of the lens member and the supporting member together. Between the light incident surface and the bonding surface, the lens member has a surface extending in a direction intersecting the light incident surface and the bonding surface.

16 Claims, 20 Drawing Sheets

(56) References Cited

U.S. PATENT DOCUMENTS

| | | | | |
|---|---|---|---|---|
| 2007/0018338 | A1* | 1/2007 | Hosseini | H01L 24/78 257/784 |
| 2021/0336411 | A1 | 10/2021 | Dejima et al. | |
| 2023/0031544 | A1 | 2/2023 | Dejima et al. | |

FOREIGN PATENT DOCUMENTS

| | | | | | |
|---|---|---|---|---|---|
| JP | 2000-501518 | A | | 2/2000 | |
| JP | 2002-525699 | A | | 8/2002 | |
| JP | 2002232064 | | * | 8/2002 | |
| JP | 2004-214326 | A | | 7/2004 | |
| JP | 2017-130543 | A | | 7/2017 | |
| JP | 2021-174933 | A | | 11/2021 | |
| WO | WO-2021/131171 | A1 | | 7/2021 | |
| WO | WO-2021171865 | A1 | * | 9/2021 | H01S 5/02326 |

* cited by examiner

LASER LIGHT SOURCE AND METHOD OF MANUFACTURING THE SAME

CROSS-REFERENCE TO RELATED APPLICATION

This application claims priority to Japanese Patent Application No. 2022-053023, filed on Mar. 29, 2022, the disclosure of which is hereby incorporated by reference in its entirety.

BACKGROUND

The present disclosure relates to a laser light source and a method of manufacturing the same.

Laser light sources that include a semiconductor laser are used for devices such as processing machines, projectors, and illumination devices. A typical example of such a laser light source includes a semiconductor laser, a base supporting the semiconductor laser, and a collimating lens to collimate laser light that is emitted from the semiconductor laser (see, for example, Japanese Patent Publication No. 2004-214326).

SUMMARY

When a bonding member is used for fixing a lens member, improvement is still needed to address the tendency of the bonding member to adhere to the light incident surface of the lens member.

In certain embodiments, a laser light source according to the present disclosure includes: a submount; a semiconductor laser element fixed to the submount, the semiconductor laser element having a light-exiting surface through which laser light is to be emitted; a lens member having a light incident surface on which the laser light is incident and a bonding surface that extends laterally from the light incident surface; a supporting member connecting the lens member and the submount together so that the light incident surface of the lens member faces the light-exiting surface of the semiconductor laser element; and an inorganic bonding layer bonding the bonding surface of the lens member and the supporting member together. Between the light incident surface and the bonding surface, the lens member has a surface extending in a direction intersecting each of the light incident surface and the bonding surface.

In certain embodiments, a method of manufacturing a laser light source according to the present disclosure includes: providing a laser semiconductor element and a submount, wherein the semiconductor laser element is configured to emit laser light and the submount is a member to which a lens support member is connected; providing a lens member having a light incident surface on which the laser light is incident and a bonding surface that extends laterally from the light incident surface, wherein the lens member has, in between the light incident surface and the bonding surface, a surface that extends in a direction intersecting each of the light incident surface and the bonding surface; bringing, the bonding surface of the lens member and a surface of the lens support member at which the lens member is supported, into contact via a metal paste containing an organic binder and metal particles dispersed in the organic binder; and bonding the lens member and the lens support member together by heating the metal paste by irradiating the lens support member with laser light for heating purposes to sinter the metal particles.

According to the present disclosure, when a bonding member is used for fixing a lens member, the bonding member is less likely to adhere to the light incident surface of the lens member.

DETAILED DESCRIPTION

Figure 1A:
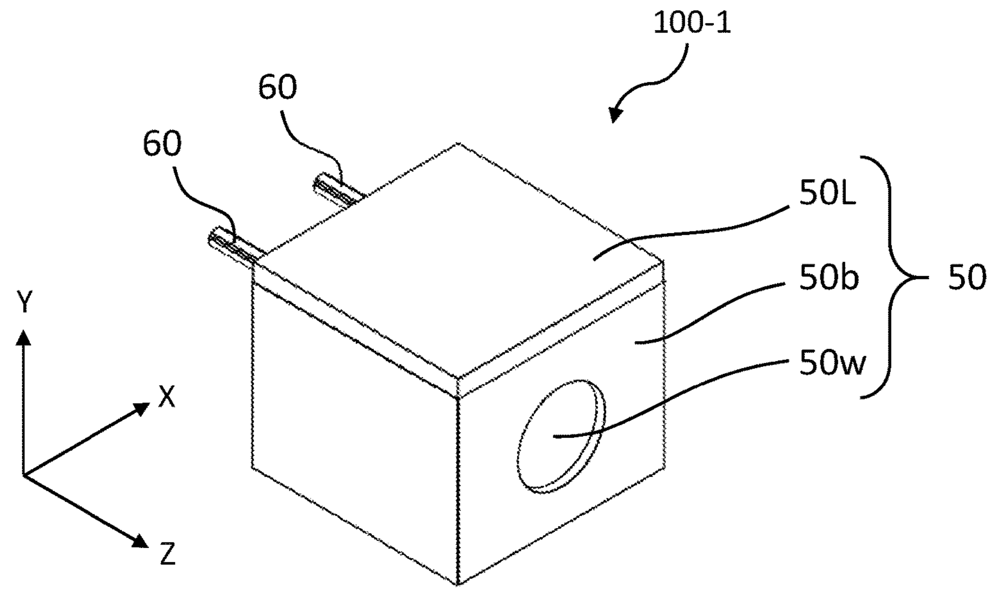
FIG. 1A is a perspective view schematically showing the configuration of a laser light source according to illustrative Embodiment 1 of the present disclosure.

Hereinafter, with reference to the drawings, laser light sources according to embodiments of the present disclosure, and methods of manufacturing the same, are described in detail. The same reference characters in a plurality of drawings denote the same or similar parts.

The description below is intended to give a concrete form to the technical ideas of the present invention, but the scope of the present invention is not intended to be limited thereto. The dimensions, material, shape, relative arrangement, etc., of the components are intended as examples, and the scope of the present invention is not intended to be limited thereto. The size, arrangement relationship, etc., of the members shown in each drawing may be exaggerated in order to facilitate understanding.

Where there is more than one of the same component, they may be prefixed with “first” and “second” in order to distinguish them from one another in the present specification or the claims. Where the manner in which the distinction is made in the present specification is different from that in the claims, the same prefix may not refer to the same member in the present specification and in the claims. For reference sake, each drawing schematically shows an X axis, a Y axis, and a Z axis that are orthogonal to one another. The direction of an arrowhead shown for the X axis will be referred to as the +X direction, whereas the opposite direction thereto will be referred to as the −X direction. In the case in which no distinction is needed between the ±X directions, these directions will simply be referred to as the X direction. The same is also true of the ±y directions and the ±Z directions. The coordinate axes do not limit the orientation of the light-exiting device during use; the orientation of the light-exiting device may be arbitrarily selected. For ease of understanding, in the specification and claims herein, the +Y direction may be “upward” or “above”; the −Y direction “downward” or “below”; the +Z direction “frontward” or “front”; and the −Z direction “rearward” or “rear.” So long as the relative directions or positions in the drawing under attention are conserved, any drawing employed outside the present disclosure, actually manufactured products, production apparatuses, or the like may not adhere to the same exact positioning as that indicated in the drawing under attention.

Embodiment 1

Laser Light Source

First, with reference to FIG. 1A to FIG. 2B, an example of a laser light source according to Embodiment 1 of the present disclosure will be described. FIG. 1A is a perspective view schematically showing the configuration of a laser light source according to illustrative Embodiment 1 of the present disclosure. A laser light source 100-1 shown in FIG. 1A includes: a semiconductor laser element that does not appear from the outside; a package 50 that houses the semiconductor laser element; and two lead terminals 60 to supply power to the semiconductor laser element. The package 50 includes a cover 50L, a base 50*b*, and a light transmissive window 50*w*. The semiconductor laser element has a light-exiting surface through which laser light is emitted. The laser light that is emitted from the light-exiting surface is extracted to the outside of the package 50 through light transmissive window 50*w*. The package 50 seals the semiconductor laser element. This sealing is preferably hermetic sealing. The shorter the wavelength of the laser light emitted from the semiconductor laser element is, the greater the effect of hermetic sealing is. The reason is that, in a configuration that is not hermetically sealed and the light-exiting surface of the semiconductor laser element is in contact with the outside air, when the wavelength of the laser light emitted from the semiconductor laser element is shorter, a dust attraction phenomenon during operation more likely to deteriorate the light-exiting surface.

Figure 1B:
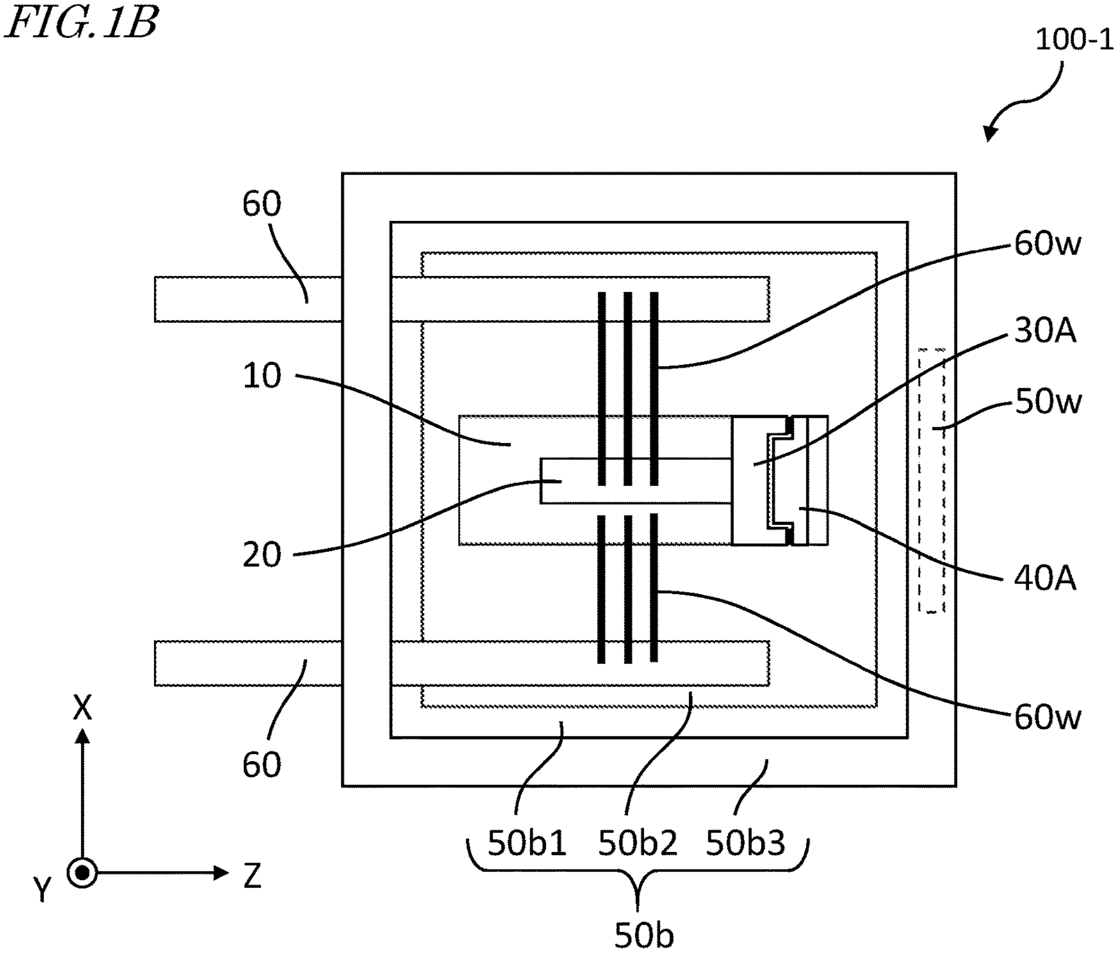
FIG. 1B is a diagram schematically showing a planar configuration inside the laser light source shown in FIG. 1A.

FIG. 1B is a diagram schematically showing a planar configuration inside the laser light source 100-1 shown in FIG. 1A. In FIG. 1B, the cover 50L is omitted from the package 50 as shown in FIG. 1A. The base 50*b* includes a bottom plate 50*b*1, a stage 50*b*2 provided on the bottom plate 50*b*1, and lateral walls 50*b*3 surrounding the stage 50*b*2. Inside the base 50*b*, the laser light source 100-1 includes: a submount 10 that is supported by the stage 50*b*2; a semiconductor laser element 20 and a supporting member 30A that are supported by the submount 10; and a lens member 40A that is supported by the supporting member 30A. The semiconductor laser element 20 emits laser light toward the lens member 40A. In the present specification, any configuration that at least includes a submount, a semiconductor laser element, a supporting member, and a lens member is referred to as a “laser light source.” A supporting member may also be referred to as a “lens support member.”

The laser light source 100-1 further includes multiple wires 60*w* inside the base 50*b*. Some of the wires 60*w* are electrically connected to the semiconductor laser element 20 via the submount 10, and electrically connected to one of the lead terminals 60. The other wires 60*w* are electrically connected directly to the semiconductor laser element 20, and electrically connected to the other lead terminal 60. The wires 60*w* are employed to supply power from the two lead terminals 60 to the semiconductor laser element 20. The two lead terminals 60 are electrically connected to an external circuit that adjusts the emission timing and the output power of laser light to be emitted from the semiconductor laser element 20.

Figure 1C:
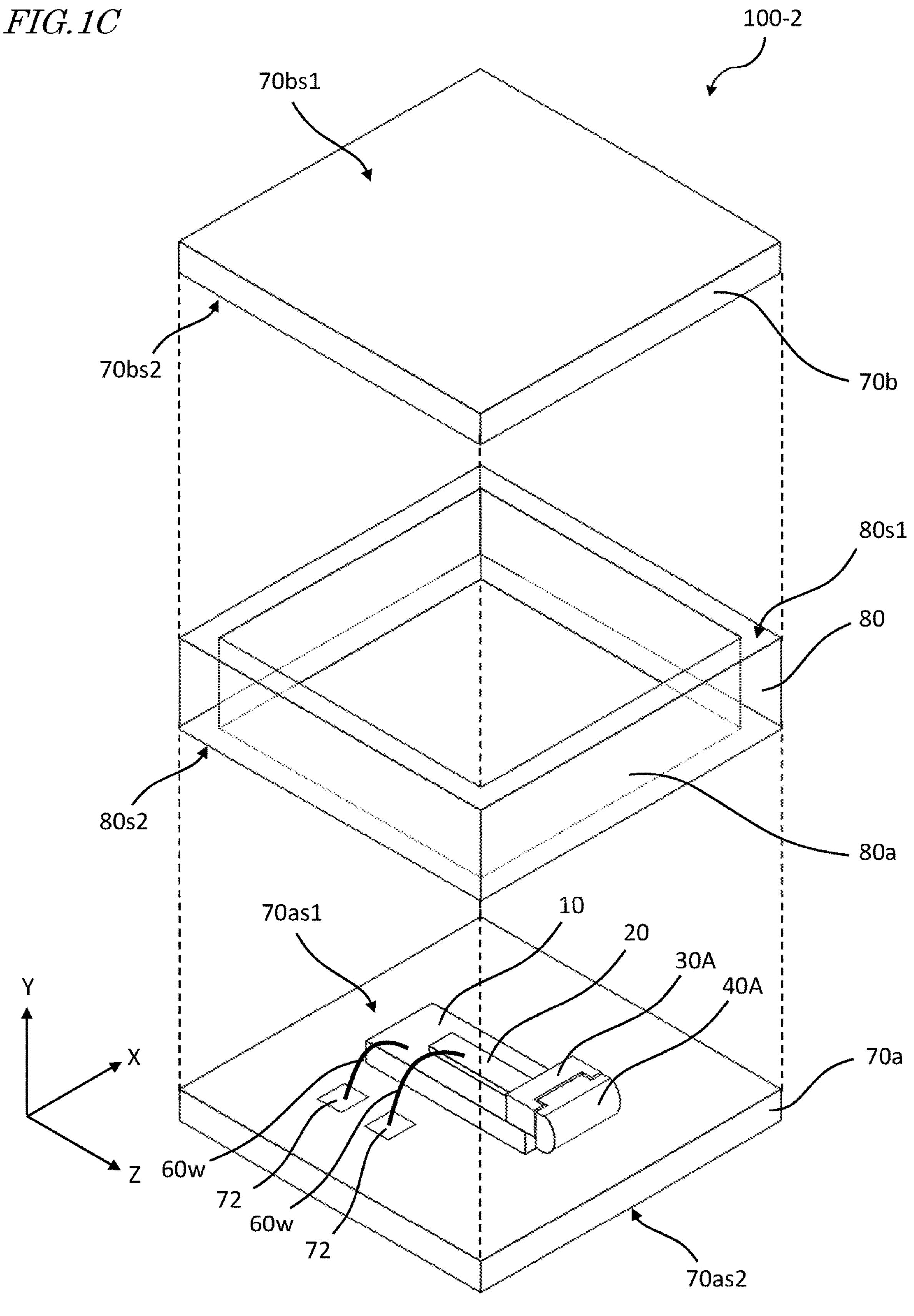
FIG. 1C is an exploded perspective view schematically showing the configuration of a laser light source according to another version of illustrative Embodiment 1 of the present disclosure.
Figure 13:
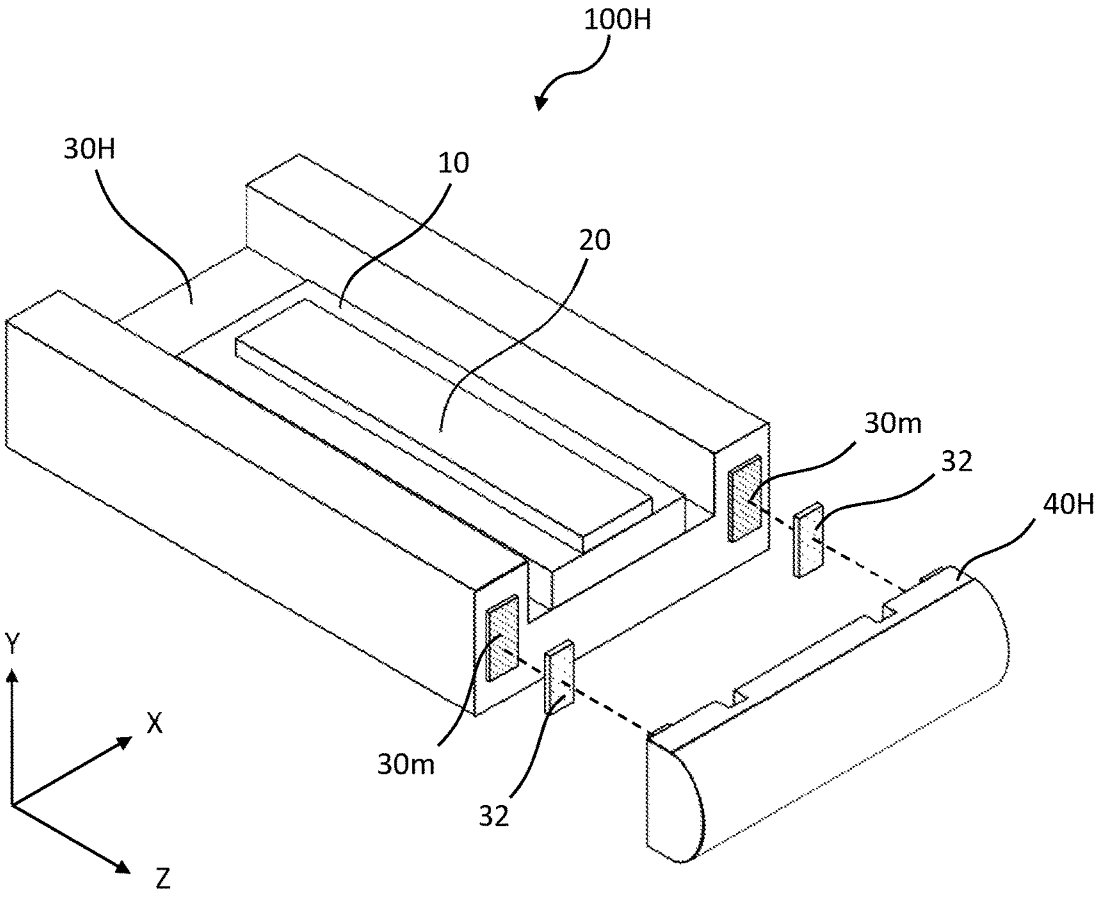
FIG. 13 is an exploded perspective view schematically showing the configuration of a laser light source according to illustrative Embodiment 8 of the present disclosure.

Instead of the laser light source 100-1 shown in FIG. 1A and FIG. 13, a laser light source as follows may be used. FIG. 1C is an exploded perspective view schematically showing the configuration of a laser light source according to another version of illustrative Embodiment 1 of the present disclosure. The laser light source 100-2 shown in FIG. 1C includes a submount 10, a semiconductor laser element 20, a supporting member 30A, a lens member 40A, two wires 60*w*, a first substrate 70*a*, a second substrate 70*b*, and a frame body 80. Although FIG. 1C illustrates the first substrate 70*a*, the second substrate 70*b*, and the frame body 80 as being separate from one another, the frame body 80 is actually bonded to the first substrate 70*a* and the second substrate 70*b*.

The first substrate 70*a* has an upper surface 70*as*1 and a lower surface 70*as*2 that are parallel to the XZ plane, such that the submount 10 is supported by the upper surface 70*as*1. The first substrate 70*a* includes two interconnects 72 that are embedded inside. A portion of each interconnect 72 is exposed on the upper surface 70*as*1, while another portion is exposed on the lower surface 70*as*2. One of the two wires 60*w* is electrically connected to the semiconductor laser element 20 via the submount 10, and electrically connected to one interconnect 72. The other wire 60*w* is electrically connected directly to the semiconductor laser element 20, and electrically connected to the other interconnect 72. The two interconnects 72 are electrically connected to an external circuit that adjusts the emission timing and the output power of laser light to be emitted from the semiconductor laser element 20.

The second substrate 70*b* has an upper surface 70*bs*1 and a lower surface 70*bs*2 that are parallel to the XZ plane, such that the lower surface 70*bs*2 of the second substrate 70*b* faces the upper surface 70*as*1 of the first substrate 70*a*. The second substrate 70*b* serves as a cover.

The frame body 80 is interposed between the first substrate 70*a* and the second substrate 70*b*, and surrounds the submount 10, the semiconductor laser element 20, the supporting member 30A, the lens member 40A, and the two wires 60*w*. The frame body 80 has an upper surface 80*s*1 and a lower surface 80*s*2 that are parallel to the XZ plane, such that the upper surface 80*s*1 of the frame body 80 is bonded to an edge region of the lower surface 70*bs*2 of the second substrate 70*b*, and that the lower surface 80*s*2 of the frame body 80 is bonded to an edge region of the upper surface 70*as*1 of the first substrate 70*a*.

The frame body 80 includes a light-transmitting portion 80*a* facing the lens member 40A. Laser light that is emitted from the semiconductor laser element 20 through the lens member 40A is extracted to the outside through the light-transmitting portion 80*a*. In the example shown in FIG. 1C, the portion of the frame body 80 other than the light-transmitting portion 80*a* is formed of the same material as the light-transmitting portion 80*a*. The portion other than the light-transmitting portion 80*a* may be formed of a material different from that of the light-transmitting portion 80*a*, and may not be light-transmissive.

The first substrate 70*a*, the second substrate 70*b*, and the frame body 80 seal the semiconductor laser element 20. As mentioned earlier, this sealing is preferably hermetic sealing.

Figure 2A:
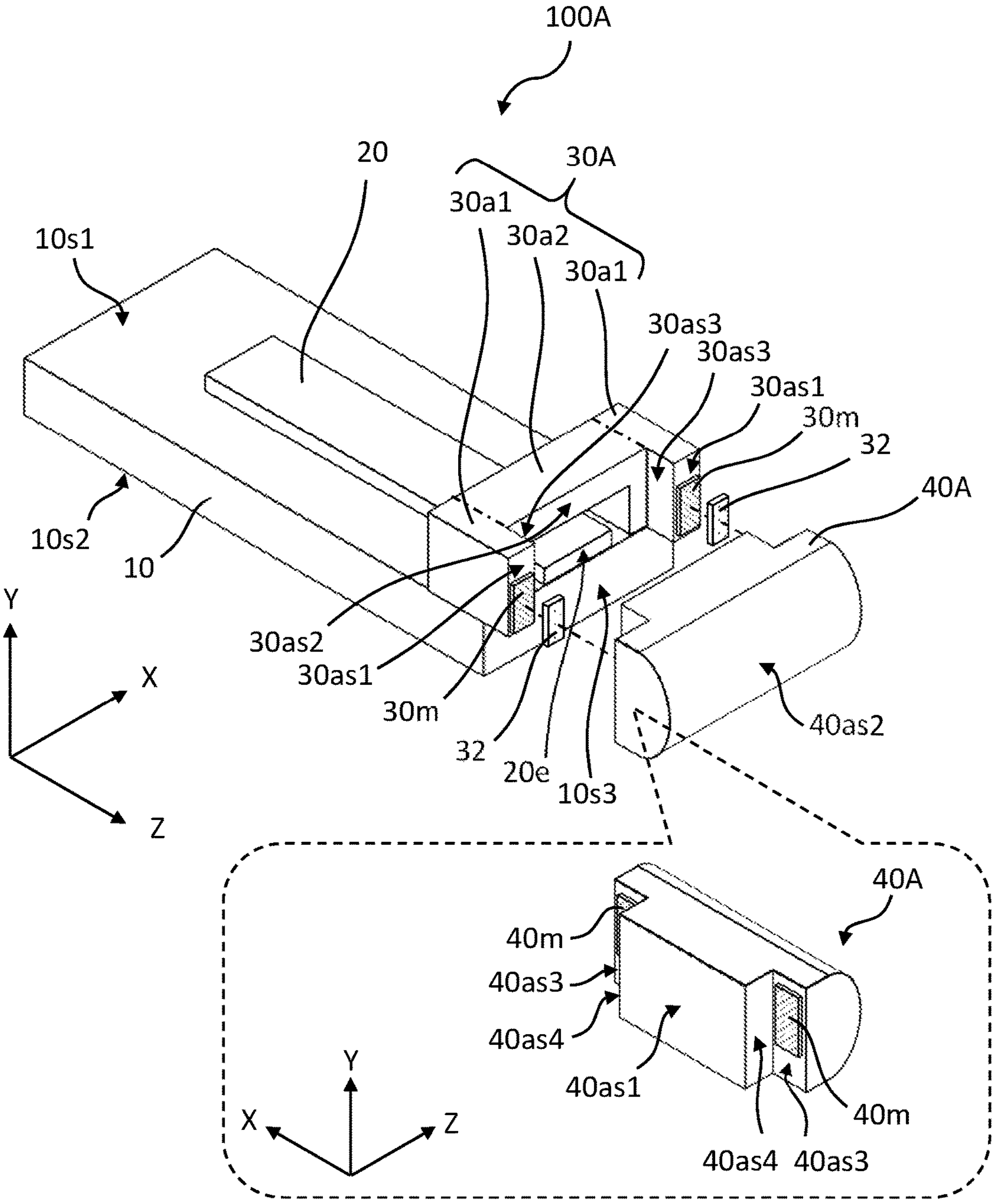
FIG. 2A is an exploded perspective view showing in more detail a configuration in which a package, lead terminals, and internal wires are omitted from the laser light source as shown in FIG. 1A.
Figure 2B:
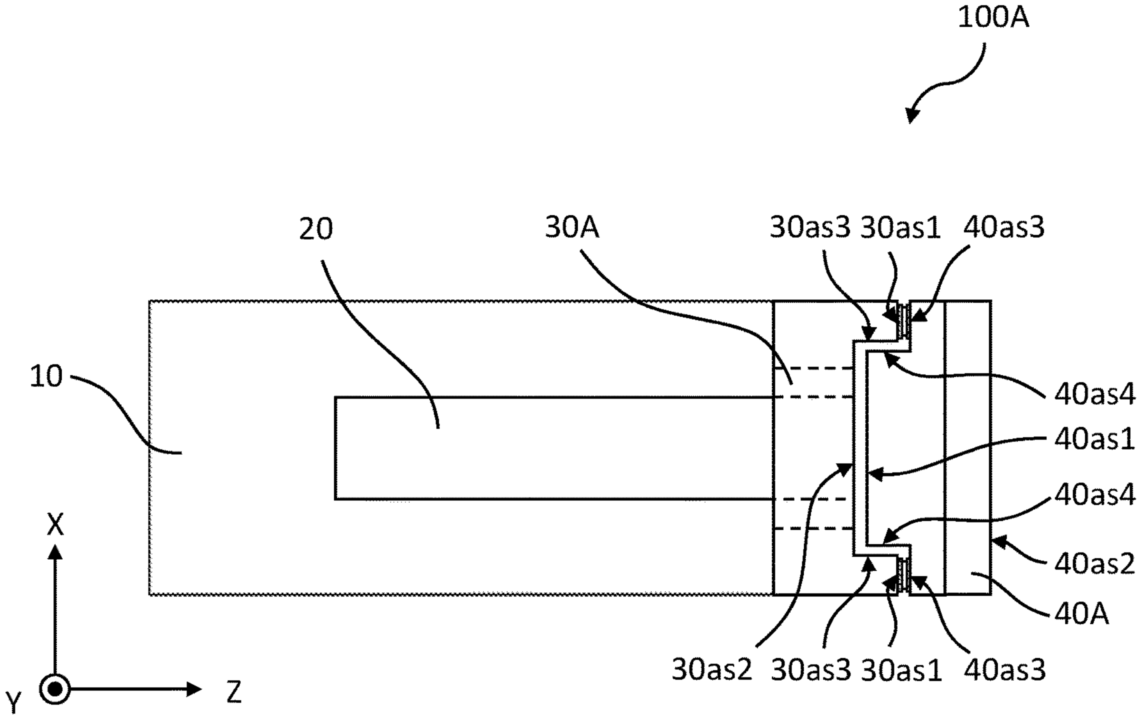
FIG. 2B is a top view of the laser light source shown in FIG. 2A.

FIG. 2A is an exploded perspective view showing in more detail a configuration in which the package 50, the lead terminals 60, and the internal wires 60*w* are omitted from the laser light source 100-1 as shown in FIG. 1A. This configuration can also be regarded as a configuration in which the first substrate 70*a*, the second substrate 70*b*, the wires 60*w*, and the frame body 80 are omitted from the laser light source 100-2 as shown in FIG. 1C. The region surrounded by a broken line in FIG. 2A illustrates the lens member 40A as viewed from the rear (i.e., from the −Z direction). The laser light source 100A shown in FIG. 2A includes the submount 10, the semiconductor laser element 20, the supporting member 30A, inorganic bonding layers 32, and the lens member 40A. Although FIG. 2A illustrates the supporting member 30A and the lens member 40A as being separate from one another, they are actually bonded to each other. FIG. 2B is a top view of the laser light source 100A shown in FIG. 2A. Broken lines in FIG. 2B represent components located below the upper surface of the supporting member 30A.

In the laser light source 100A, the lens member 40A is shaped so that its light incident surface protrudes rearward (i.e., in the −Z direction). Correspondingly to the shape of the lens member 40A, the supporting member 30A is shaped so that its surface facing the light incident surface of the lens member 40A is set back in the rearward direction (i.e., in the −Z direction). As will be described in detail below, the rearward-protruding shape (i.e., protruding in the −Z direction) of the lens member 40A provides an effect in that, during the bonding of the supporting member 30A and the lens member 40A, an inorganic bonding member that may be used for fixing the lens member 40A is less likely to adhere to the light incident surface of the lens member 40A and the light-exiting surface of the semiconductor laser element 20.

Hereinafter, the respective components will be described. Details of each component, e.g., its material and dimensions, will be described later.

As shown in FIG. 2A, the submount 10 has an upper surface 10*s*1 and a lower surface 10*s*2 that are parallel to the XZ plane. The submount 10 also has a front end surface 10*s*3 that interconnects the upper surface 10*s*1 and the lower surface 10*s*2. Although the submount 10 has the shape of a rectangular solid in the example shown in FIG. 2A, it may have any discretionary flat-plate-shape. The normal direction of the upper surface 10*s*1 is the +Y direction.

As shown in FIG. 2A, the semiconductor laser element 20 is fixed to the upper surface 10*s*1 of the submount 10. In the example shown in FIG. 2A and FIG. 2B, the semiconductor laser element 20 has the shape of a rectangular solid elongated in the Z direction. The semiconductor laser element 20 has two end surfaces that intersect the Z direction. Regarding the two end surfaces, the front end surface, which is located closer to the lens member 40A, defines a light-exiting surface 20*e* through which laser light exits. The light-exiting surface 20*e* has a rectangular shape extending along the X direction.

The semiconductor laser element 20 emits laser light in the +Z direction from the light-exiting surface 20*e*. The optical axis direction of the laser light is the +Z direction. As the laser light travels in the +Z direction, the light spreads relatively fast along the YZ plane and relatively slowly along the XZ plane. As a result, the laser light creates a far field pattern of an elliptical shape in a plane that is parallel to the light-exiting surface 20*e*. The major axis of the ellipse is parallel to the Y direction, whereas the minor axis is parallel to the X direction. A far field pattern refers to an optical intensity distribution of light at a position away from the light-exiting surface 20*e*. In the optical intensity distribution, a portion of laser light whose intensity is $1/e^2$ or greater with respect to the peak intensity of the laser light may be referred to as its "main portion." Herein, e is the base of the natural logarithm.

As shown in FIG. 2A, the supporting member 30A is fixed to the upper surface 10*s*1 of the submount 10. The supporting member 30A connects together the lens member 40A and the submount 10. The supporting member 30A includes two support portions 30*a*1 and a linking portion 30*a*2 that links together the two support portions 30*a*1. The semiconductor laser element 20 is located between the two support portions 30*a*1. Each dot-dash line shown in FIG. 2A represents a boundary between one of the two support portions 30*a*1 and the linking portion 30*a*2. Although the linking portion 30*a*2 of the supporting member 30A is illustrated as having a shape extending astride the semiconductor laser element 20, it may alternatively have a rectangular solid shape that links together the upper portions of the two support portions 30*a*1. The supporting member 30A does not hinder the travel of laser light that is emitted from the semiconductor laser element 20.

The supporting member 30A has a first front end surface 30*as*1 in each of the two support portions 30*a*1, and has a second front end surface 30*as*2 in the linking portion 30*a*2. Each first front end surface 30*as*1 is a surface that supports the lens member 40A. The supporting member 30A may support the lens member 40A at both of the two first front end surfaces 30*as*1, or support the lens member 40A at only one of the first front end surfaces 30*as*1. Each of the first front end surfaces 30*as*1 and the second front end surface 30*as*2 may be a plane, for example. These two kinds of surfaces may be parallel to each other, for example. When the first front end surfaces 30*as*1 are planes, the lens member 40A can be stably supported.

In the present specification, the term "plane" implies a flatness of 0.01 mm or lower. According to JIS 0621-1984, for example, "flatness" is defined as the magnitude of deviation from a geometrically precise plane of a planar shape (hereinafter "geometric plane.") When an object is interposed between two geometric planes that are strictly parallel to each other, "flatness" is the dimension of the interspace between the two geometric planes. Flatness can be measured with a three-dimensional measuring machine, for example. In the present specification, when it is said that two planes are parallel, it encompasses not only the case where the two planes are strictly parallel, but also the case where the absolute value of an angle made by the two planes is 0.5° or less.

Correspondingly to the shape of the lens member 40A, the supporting member 30A is shaped so that the second front end surface 30*as*2 is set back from the first front end surfaces 30*as*1 in the rearward direction (i.e., in the −Z direction). Because of having this shape, the supporting member 30A includes two stepped portions 30*as*3. Each of the two stepped portions 30*as*3 is located between the corresponding one of the two first front end surfaces 30*as*1 and the second front end surface 30*as*2, and interconnects that first front end surface 30*as*1 and the second front end surface 30*as*2. Each stepped portion 30*as*3 may be a plane, for example. The height of each stepped portion 30*as*3 (i.e., dimension along the Z direction) may be not less than 10 μm and not more than 1 mm, for example.

In the present specification, a surface that interconnects a protruding surface (which protrudes from a reference plane) and a set-back surface (which is set back from the reference plane) is referred to as a "stepped portion." The protruding surface and the set-back surface are not located on the same plane. The stepped portion can be regarded as a portion of the surface of a structure that includes the protruding surface and the set-back surface, and is located between the protruding surface and the set-back surface.

The height of the stepped portion is the magnitude of the step difference existing between the protruding surface and the set-back surface. When the stepped surface is not perpendicular to the set-back surface, the height of the stepped surface is defined by the dimension of an imaginary plane that emerges as the stepped surface is projected onto a plane that is perpendicular to the set-back surface, this dimension being taken along the normal direction of the set-back surface. The perpendicular plane and the normal direction are located on a line at which the set-back surface and the stepped portion are tangential.

The supporting member 30A includes metal films 30*m* each provided on one of the two first front end surfaces 30*as*1. The metal films 30*m* are indicated by dense hatching in FIG. 2A. The metal films 30*m* provide an improved bonding strength when bonding the lens member 40A to the supporting member 30A with an inorganic bonding member.

As shown in FIG. 2A, the inorganic bonding layers 32 are located between the supporting member 30A and the lens member 40A. The inorganic bonding layers 32 shown in FIG. 2A are indicated by thin hatching. The inorganic bonding layers 32 bond together bonding surfaces 40*as*3 of the lens member 40A and the first front end surfaces 30*as*1 of the supporting member 30A. The inorganic bonding layers 32 are formed by heating the inorganic bonding member that is to bond together the supporting member 30A and the lens member 40A. The inorganic bonding member may be a sinterable material, for example. In sintering, a granular form or powder form of metal is firmly baked by being heated at a temperature that is lower than the melting point of the metal, whereby multiple members are bonded together.

As the inorganic bonding member, a metal paste may be used, for example. The metal paste contains an organic binder and metal particles that are dispersed therein. Because the metal paste is fluid, when the metal particles in the metal paste are sintered through heating so as to bond together the supporting member 30A and the lens member 40A, it is possible to adjust the optical axis of the lens member 40A, as will be described below. The organic binder in the metal paste volatilizes during the heating, and the remaining sintered metal particles form the inorganic bonding layers 32. Although the inorganic bonding layers 32 are illustrated in rectangular shapes in the example shown in FIG. 2A for simplicity, the shape of each inorganic bonding layer 32 after having been sintered does not need to be a rectangular, but may be any discretionary shape, e.g., an ellipse.

The inorganic bonding layers 32 provide the following advantage. Even though the laser light source 100A may be hermetically sealed by the package 50 shown in FIG. 1A, if an organic gas is present inside the package 50, the organic gas may cause dust attraction, which in turn may deteriorate the light-exiting surface 20*e* of the semiconductor laser element 20. Because the inorganic bonding layers 32 do not produce any organic gas, the aforementioned deterioration of the light-exiting surface 20*e* of the semiconductor laser element 20 can be suppressed.

The lens member 40A has a light incident surface 40*as*1 on which laser light is incident, and a light-exiting surface 40*as*2 from which the laser light exits. The lens member 40A also has two bonding surfaces 40*as*3 extending laterally from the light incident surface 40*as*1. Each of the light incident surface 40*as*1 and the bonding surfaces 40*as*3 may be a plane, for example. When the light incident surface 40*as*1 is a plane, scattering of incident laser light can be reduced. When the bonding surfaces 40*as*3 are planes, and if the first front end surfaces 30*as*1 of the supporting member 30A are also planes, these two kinds of surfaces can be adjusted to be parallel to each other, thereby facilitating the optical axis adjustment of the lens member 40A at bonding of the supporting member 30A and the lens member 40A. Furthermore, the light incident surface 40*as*1 and each bonding surface 40*as*3 of the lens member 40A may also be parallel to each other, for example. These two kinds of surfaces being parallel to each other will also facilitate the optical axis adjustment of the lens member 40A at bonding of the supporting member 30A and the lens member 40A.

As shown in FIG. 2A, the lens member 40A is shaped so that its light incident surface 40*as*1 protrudes rearward (i.e., in the −Z direction) from the bonding surfaces 40*as*3. Because of having this shape, the lens member 40A includes two stepped portions 40*as*4. Each of the two stepped portions 40*as*4 is located between the light incident surface 40*as*1 and the corresponding one of the two bonding surfaces 40*as*3, and interconnects the light incident surface 40*as*1 and that bonding surface 40*as*3. The stepped portions 40*as*4 may be planes, for example.

In the example shown in FIG. 2A, each stepped portion 40*as*4 is a surface extending in directions perpendicular to each of the light incident surface 40*as*1 and the bonding surfaces 40*as*3, but this is not limited thereto; it may be any surface extending in directions intersecting each of the light incident surface 40*as*1 and the bonding surfaces 40*as*3. The angle made by each stepped portion 40*as*4 and each of the light incident surface 40*as*1 and the bonding surfaces 40*as*3 may be not less than 80° and not more than 100°, for example. The height (along the Z direction) of each stepped portion 40*as*4 may be not less than 10 μm and not more than 1 mm, for example.

The lens member 40A includes a collimating section having a curvature in the YZ plane, this curvature being uniform along the X direction. This collimating section, in the lens member 40A has the light incident surface 40*as*1. The supporting member 30A fixes the lens member 40A so that the light incident surface 40*as*1 of the lens member 40A faces the light-exiting surface 20*e* of the semiconductor laser element 20. The lens member 40A has a focal point rearward (i.e., in the −Z direction) on its optical axis. The center of the emission point of the light-exiting surface 20*e* of the semiconductor laser element 20 substantially coincides with the focal point of the lens member 40A. Therefore, the lens member 40A allows the laser light to exit frontward (i.e., in the +Z direction) from the light-exiting surface 40*as*2 to allow the laser light emitted from the semiconductor laser element 20 to be collimated in the YZ plane. The optical axis of the lens member 40A substantially coincides with the optical axis of laser light emitted from the semiconductor laser element 20. In the present specification, to "collimate" means not only converting laser light into parallel light, but also reducing the angle of spread of laser light.

Depending on the application, the lens member 40A may have a curvature in the YZ plane and in the XZ plane, and allow the laser light emitted from the semiconductor laser element 20 to be collimated in the YZ plane and in the XZ plane. Alternatively, the lens member 40A may converge the laser light emitted from the semiconductor laser element 20.

The lens member 40A has a transmittance of 60% or more, preferably 90% or more, and more preferably 95% or more with respect to the laser light emitted from the semiconductor laser element 20. The lens member 40A may be formed of a light-transmissive material, for example. The specific light-transmissive material will be described later. The lens member 40A includes metal films 40*m* respectively provided on the two bonding surfaces 40*as*3. The metal films 40*m* are indicated by dense hatching in FIG. 2A. Similarly to the metal films 30*m*, the metal films 40*m* provide an improved bonding strength when bonding the lens member 40A to the supporting member 30A with an inorganic bonding member.

In the laser light source 100A, because the supporting member 30A supports the lens member 40A, the distance between the light-exiting surface 20*e* of the semiconductor laser element 20 and the light incident surface 40*as*1 of the lens member 40A is reduced. Therefore, before the laser light emitted from the semiconductor laser element 20 spreads wide, the spread can be reduced by the lens member 40A, whereby a smaller-sized laser light source 100A can be realized.

Regarding the X direction, the centroid of the lens member 40A is located between the two first front end surfaces 30*as*1 of the supporting member 30A and therefore does not overlap the two first front end surfaces 30*as*1, as viewed from the optical axis direction of the laser light emitted from the semiconductor laser element 20 (i.e., as viewed from the front (the +Z direction)). Regarding the Y direction, as viewed from the front, the centroid of the lens member 40A is at a position that is level with or higher than a lower side of each first front end surface 30*as*1 (which can be regarded as having an upper side and a lower side) and lower than its upper side. By keeping the centroid of the lens member 40A at this position, the supporting member 30A can stably support the lens member 40A.

Specific Relative Positioning of Components

Next, the specific relative positioning of the submount 10, the semiconductor laser element 20, the supporting member 30A, and the lens member 40A will be described.

The positioning of the semiconductor laser element 20 and the supporting member 30A is as follows. In the example shown in FIG. 2A, a front portion of the semiconductor laser element 20 is located between the two support portions 30*a*1 of the supporting member 30A, while a middle portion and a rear portion thereof are not located between the two support portions 30*a*1. In an alternative arrangement, the front portion and the middle portion of the semiconductor laser element 20 may be located between the two support portions 30*a*1, without the rear portion being located between the two support portions 30*a*1. Further alternatively, the front portion, the middle portion, and the rear portion of the semiconductor laser element 20 may all be located between the two support portions 30*a*1. The front portion and the rear portion of the semiconductor laser element 20 are defined as portions at which ¼ or less of the overall length of the semiconductor laser element 20 extends from its front end surface and rear end surface, respectively, and the middle portion is defined as a portion located between the front portion and the rear portion.

The positioning of the light-exiting surface 20*e* of the semiconductor laser element 20 and the front end surface 10*s*3 of the submount 10 is as follows. In the example shown in FIG. 2A, the light-exiting surface 20*e* of the semiconductor laser element 20 is located on the same plane as the front end surface 10*s*3 of the submount 10. Depending on the position of the focal point of the lens member 40A, the light-exiting surface 20*e* of the semiconductor laser element 20 may be located frontward (i.e., in the +Z direction) or rearward (i.e., in the −Z direction) of the front end surface 10*s*3 of the submount 10.

The positioning of the light-exiting surface 20*e* of the semiconductor laser element 20 and the surfaces of the supporting member 30A is as follows. In the example shown in FIG. 2A, the light-exiting surface 20*e* of the semiconductor laser element 20 is located rearward (i.e., in the −Z direction) of the first front end surfaces 30*as*1 of the supporting member 30A. The light-exiting surface 20*e* of the semiconductor laser element 20 is located on the same plane as the second front end surface 30*as*2 of the supporting member 30A. Depending on the position of the focal point of the lens member 40A, the light-exiting surface 20*e* of the semiconductor laser element 20 may be located frontward (i.e., in the +Z direction) or rearward (i.e., in the −Z direction) of the second front end surface 30*as*2 of the supporting member 30A.

The positioning of the surfaces of the supporting member 30A and the front end surface 10*s*3 of the submount 10 is as follows. In the example shown in FIG. 2A, the first front end surfaces 30*as*1 of the supporting member 30A is located frontward (i.e. in the +Z direction) of the front end surface 10*s*3 of the submount 10, whereas the second front end surface 30*as*2 of the supporting member 30A is located on the same plane as the front end surface 10*s*3 of the submount 10. The second front end surface 30*as*2 may be located frontward (i.e., in the +Z direction) or located rearward (i.e., in the −Z direction) of the front end surface 10*s*3 of the submount 10.

The positioning of the surfaces of the lens member 40A and the surfaces of the supporting member 30A is as follows. In the example shown in FIG. 2B, the light incident surface 40*as*1 of the lens member 40A is located rearward (i.e., in the −Z direction) of the first front end surfaces 30*as*1 of the supporting member 30A. The light incident surface 40*as*1 of the lens member 40A faces the second front end surface 30*as*2 of the supporting member 30A. The bonding surfaces 40*as*3 of the lens member 40A face the first front end surfaces 30*as*1 of the supporting member 30A. The stepped portions 40*as*4 of the lens member 40A face the stepped portions 30*as*3 of the supporting member 30A.

Bonding of the Supporting Member 30A and the Lens Member 40A

Figure 3A:
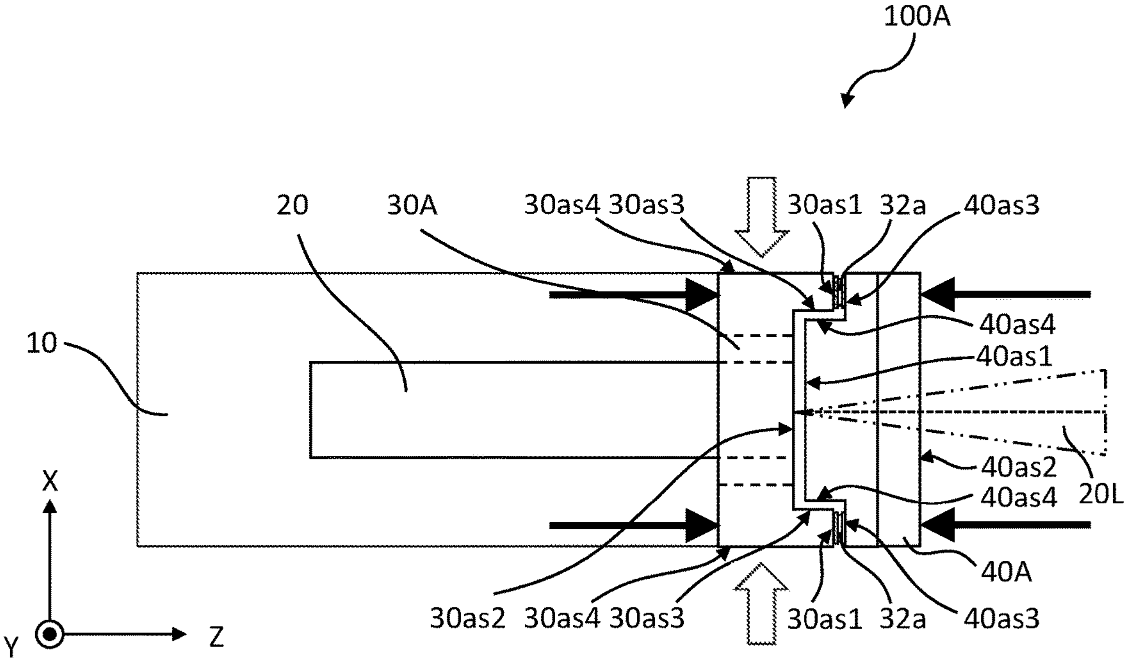
FIG. 3A is a top view for describing the method of bonding a supporting member and a lens member according to Embodiment 1.
Figure 3B:
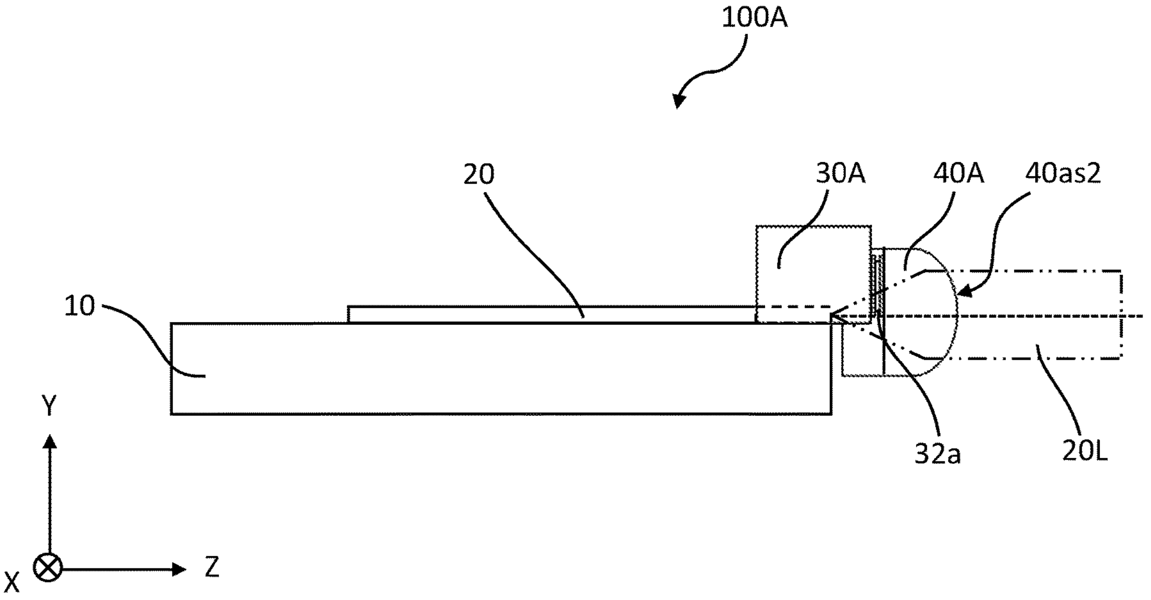
FIG. 3B is a lateral side view for illustrating the method of bonding a supporting member and a lens member according to Embodiment 1.

Next, with reference to FIG. 3A and FIG. 3B, a method of bonding the supporting member 30A and the lens member 40A will be described. FIG. 3A and FIG. 3B are a top view and a side view, respectively, for describing the method of bonding the supporting member 30A and the lens member 40A according to Embodiment 1. A region surrounded by a chain double-dashed line in FIG. 3A and FIG. 3B represents a main portion of the laser light 20L emitted from the semiconductor laser element 20. In the example shown in FIG. 3A and FIG. 3B, a metal paste 32*a* is used as an inorganic bonding member for bonding together the supporting member 30A and the lens member 40A.

In a first step, the submount 10, with the semiconductor laser element 20 and the supporting member 30A connected thereto, and the lens member 40A are provided. In a next step, the submount 10 and the lens member 40A having been provided are disposed so that the bonding surfaces 40*as*3 of the lens member 40A are brought in contact with the first front end surfaces 30*as*1 of the supporting member 30A via the metal paste 32*a* as shown in FIG. 3A (bring into contact step). Before thus positioning the submount 10 and the lens member 40A, the metal paste 32*a* is applied to the bonding surfaces 40*as*3 of the lens member 40A and/or the first front end surfaces 30*as*1 of the supporting member 30A. In a subsequent step, as shown in FIG. 3A, the supporting member 30A is irradiated with laser light for heating purposes, whereby the metal paste 32*a* is heated. Blank arrows in FIG. 3A indicate directions in which laser light for heating purposes is radiated. At each of the two support portions 30*a*1, the supporting member 30A includes outer lateral surfaces 30*as*4 to be irradiated with the laser light for heating purposes. As a result of the outer lateral surfaces 30*as*4 of the supporting member 30A being irradiated with the laser light for heating purposes, heat is transmitted from the two support portions 30*a*1 of the supporting member 30A to the metal paste 32*a*, whereby metal particles in the metal paste 32*a* is sintered so as to bond together the supporting member 30A and the lens member 40A (bonding step). The organic binder in the metal paste 32*a* volatilizes during the heating. If some organic binder remains without completely volatilizing, the intermediate product shown in FIG. 3A may be heated in an oven to allow the remaining organic binder to completely volatilize.

The power density of the laser light for heating purposes may be not less than 10 $kW/cm^2$ and not more than 10000 $kW/cm^2$, for example. The irradiation time of the laser light may be not less than 1 ms and not more than 50 ms, for example. There is no particular limitation as to the wavelength of the laser light for heating purposes. As the laser light for heating purposes, ultraviolet light, blue light, green light, red light, or infrared light can be used, for example. In the case in which the laser light for heating purposes is infrared light, the wavelength of the laser light for heating purposes may be not less than 0.9 μm and not more than 1.2 μm, for example. A light source for emitting laser light of such a wavelength may be a YAG laser light source, for example.

In the case in which the outer lateral surfaces 30*as*4 of the supporting member 30A have a high reflectance, the laser light for heating purposes may be irradiated obliquely, rather than in a perpendicular direction. Such irradiation restrains reflected light from returning to the source of laser light for heating purposes, thereby protecting the source of laser light for heating purposes.

Between the aforementioned contact step and bonding step, an additional step may be introduced, in which the position of the lens member 40A is finely adjusted while the semiconductor laser element 20 keeps emitting laser light, thus effecting an optical axis adjustment of the lens member 40A for achieving collimation of the laser light 20L. The fluid nature of the metal paste 32*a* enables such an optical axis adjustment. During the optical axis adjustment, it is possible to determine whether the laser light 20L is being collimated or not based on measurements of the angle of spread of the laser light 20L that is emitted from the light-exiting surface 40*as*2 of the lens member 40A.

However, when the metal paste 32*a* is heated, the metal paste 32*a* may shrink through sintering, whereby the position of the lens member 40A may shift. The optical axis adjustment of the lens member 40A takes into consideration the amount of such a shift in the position of the lens member 40A. The amount of shift may be not less than 0.1 μm and not more than 3 μm, for example.

In the step of bonding the submount 10 and the lens member 40A together by heating the metal paste 32*a*, the lens member 40A and the supporting member 30A (which are retained in the state after the optical axis adjustment) are pressurized in directions opposite from each other as indicated by bold arrows in FIG. 3A. This pressurization provides for an improved bonding strength of the lens member 40A and the supporting member 30A.

In this manner, as shown in FIG. 3B, the lens member 40A can be mounted at a position where it is able to accurately collimate the laser light 20L.

The interspaces existing between the protruding portions of the lens member 40A and the set-back portions of the supporting member 30A facilitates the optical axis adjustment of the lens member 40A. In the example shown in FIG. 3A, interspaces exist between the stepped portions 40*as*4 of the lens member 40A and the stepped portions 30*as*3 of the supporting member 30A, and between the light incident surface 40*as*1 of the lens member 40A and the second front end surface 30*as*2 of the supporting member 30A. Therefore, the position of the lens member 40A can be finely adjusted by slightly shifting the lens member 40A along the X direction and/or the Z direction, or slightly rotating the lens member 40A around the Y axis as a rotation axis.

The range of the aforementioned interspaces that allows for such fine adjustments is as follows. The interspace between the stepped portions 40*as*4 of the lens member 40A and corresponding stepped portions 30*as*3 of the supporting member 30A may be not less than 5 μm and not more than 500 μm, for example. The interspace between the light incident surface 40*as*1 of the lens member 40A and the second front end surface 30*as*2 of the supporting member 30A may be not less than 5 μm and not more than 500 μm, for example.

[Effects Achieved by the Shape of the Lens Member 40A Protruding Rearward (i.e., in the −Z Direction)]

Next, effects achieved by the shape of the lens member 40A protruding rearward (i.e., in the −Z direction) will be described. When the metal paste 32*a* is heated, the organic binder may bump, whereby portions of the metal paste 32*a* (which is a mass of organic binder containing metal particles) may disperse into the air, or disperse along the bonding surfaces 40*as*3 of the lens member 40A.

In a configuration unlike Embodiment 1, i.e., a configuration where the light incident surface 40*as*1 and the bonding surfaces 40*as*3 of the lens member 40A are continuous and located on the same plane, the dispersed portions of the metal paste 32*a* may adhere to the light incident surface 40*as*1 of the lens member 40A. As a result of this, during operation, the metal particles in the metal paste 32*a* that have adhered may absorb the laser light 20L and is heated, thereby damaging the lens member 40A. Furthermore, the metal particles in the metal paste 32*a* that have adhered may reflect the laser light 20L to produce returned light, this returned light possibly damaging the semiconductor laser element 20. Furthermore, the metal particles in the metal paste 32*a* that have adhered may hinder the travel of a portion of the laser light 20L, such that the laser light 20L emitted from the light-exiting surface 40*as*2 of the lens member 40A may become distorted in shape.

On the other hand, in Embodiment 1, the light incident surface 40*as*1 and the bonding surfaces 40*as*3 of the lens member 40A are not located on the same plane, and the stepped portions 40*as*4 exist between the light incident surface 40*as*1 and the bonding surfaces 40*as*3. Therefore, even if the organic binder bumps through heating to allow portions of the metal paste 32*a* to disperse, the stepped portions 40*as*4 will serve as barriers to restrain portions of the metal paste 32*a* from adhering to the light incident surface 40*as*1. This will make it less likely for the lens member 40A to be damaged through heating, for the semiconductor laser element 20 to be damaged by returned light, or for the laser light 20L to be distorted in shape.

Preferably, it is not only to the light incident surface 40*as*1 of the lens member 40A but also to the light-exiting surface 20*e* of the semiconductor laser element 20 that portions of the metal paste 32*a* are prevented from adhering. If portions of the metal paste 32*a* happen to adhere to the light-exiting surface 20*e* of the semiconductor laser element 20, emission of the laser light 20L from the semiconductor laser element 20 may be hindered, or the laser light 20L may become distorted in shape. The stepped portions 40*as*4 of the lens member 40A can also make it less likely for portions of the metal paste 32*a* to adhere to the light-exiting surface 20*e* of the semiconductor laser element 20.

If the height of the stepped portions 40*as*4 of the lens member 40A is too small, portions of the metal paste 32*a* may overflow the stepped portions 40*as*4 to adhere to the light incident surface 40*as*1 of the lens member 40A and/or the light-exiting surface 20*e* of the semiconductor laser element 20. When the height of the stepped portions 40*as*4 is in the aforementioned range of values, such adhesion of portions of the metal paste 32*a* can be effectively restrained.

If the interspace between the stepped portions 40*as*4 of the lens member 40A and the stepped portions 30*as*3 of the supporting member 30A is too small, portions of the metal paste 32*a* may overflow the stepped portions 40*as*4 to adhere to the light incident surface 40*as*1 of the lens member 40A and/or the light-exiting surface 20*e* of the semiconductor laser element 20. When the interspace between the stepped portions 40*as*4 of the lens member 40A and the stepped portions 30*as*3 of the supporting member 30A is in the aforementioned range of values, such adhesion of portions of the metal paste 32*a* can be effectively restrained.

Thus, according to Embodiment 1, a laser light source 100A can be realized in which none or little of the metal paste 32*a* is adhering to the light incident surface 40*as*1 of the lens member 40A or to the light-exiting surface 20*e* of the semiconductor laser element 20. When it is said that "little of the metal paste 32*a* adheres/has adhered," it is meant that the metal paste 32*a* may have adhered but only to an extent where the aforementioned disadvantages do not occur.

Modified Example of Embodiment 1

Figure 4A:
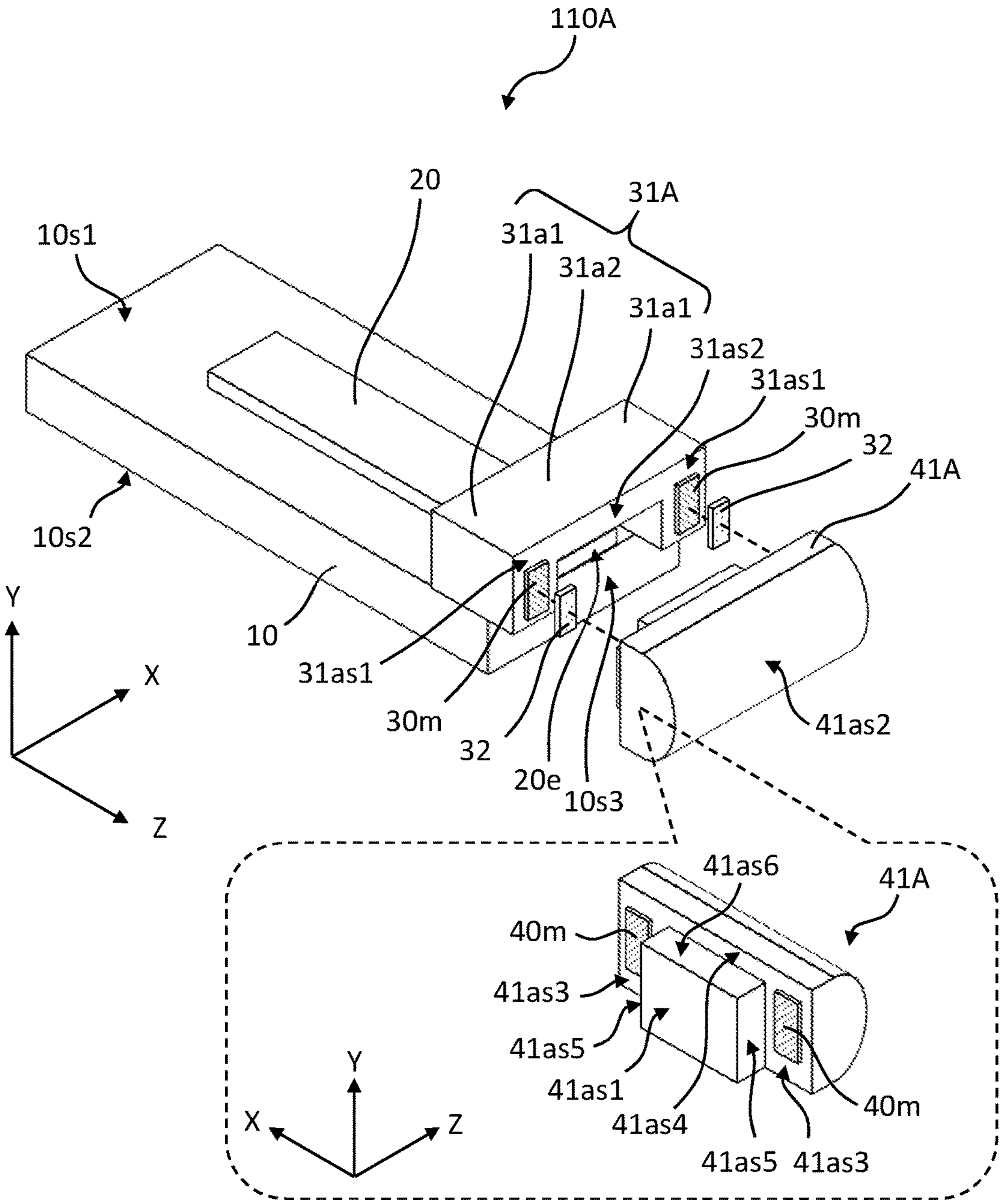
FIG. 4A is an exploded perspective view schematically showing a modified example of the laser light source according to Embodiment 1.
Figure 4B:
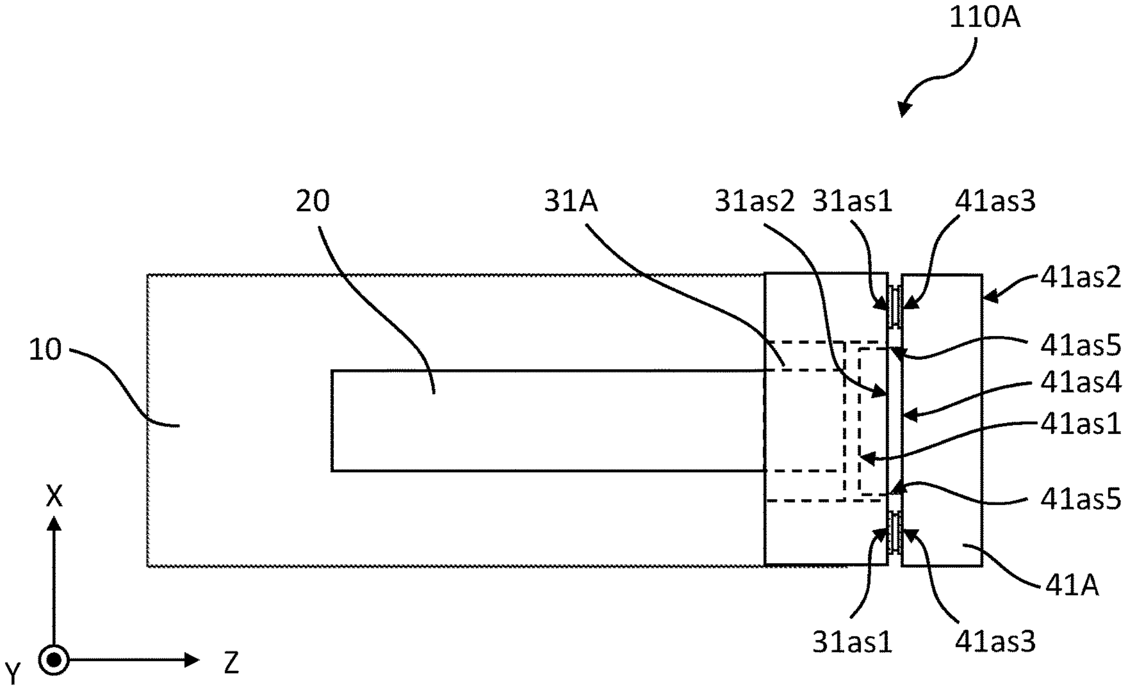
FIG. 4B is a top view of the laser light source shown in FIG. 4A.

Next, with reference to FIG. 4A and FIG. 4B, a modified example of the laser light source 100A according to Embodiment 1 will be described. FIG. 4A is an exploded perspective view schematically showing a modified example of the laser light source according to Embodiment 1. FIG. 4B is a top view of the laser light source shown in FIG. 4A. The laser light source 110A shown in FIG. 4A differs from the laser light source 100A shown in FIG. 2A with respect to the shapes of the supporting member 31A and the lens member 41A. Hereinafter, mainly the differences between the laser light source 110A and the laser light source 100A will be described.

The supporting member 31A includes two support portions 31*a*1 and a linking portion 31*a*2 that links together the two support portions 31*a*1. The semiconductor laser element 20 is located between the two support portions 31*a*1. The supporting member 31A has a first front end surface 31*as*1 in each of the two support portions 31*a*1, and has a second front end surface 31*as*2 in the linking portion 31*a*2. Each first front end surface 31*as*1 is a surface that supports the lens member 41A. The supporting member 31A may support the lens member 41A at both of the two first front end surfaces 31*as*1, or support the lens member 41A at only one of the first front end surfaces 31*as*1. The first front end surfaces 31*as*1 and the second front end surface 31*as*2 are located on the same plane that is parallel to the XY plane. Because the supporting member 31A has a uniform cross-sectional shape regarding the Z direction, it is easier to manufacture than the supporting member 30A shown in FIG. 2A.

The lens member 41A has a light incident surface 41*as*1 and a light-exiting surface 41*as*2. The lens member 41A also has two bonding surfaces 41*as*3 extending laterally from the light incident surface 41*as*1 and a surface 41*as*4 that interconnects upper portions of the two bonding surfaces 41*as*3. Each of the light incident surface 41*as*1, the bonding surfaces 41*as*3, and the surface 41*as*4 may be a plane, for example. These surfaces may be parallel to one another, for example.

The lens member 41A is shaped so that the light incident surface 41*as*1 protrudes rearward (i.e., in the −Z direction) from the bonding surfaces 41*as*3 and the surface 41*as*4. Because of having this shape, the lens member 41A includes two stepped portions 41*as*5 and a stepped portion 41*as*6. Each of the two stepped portions 41*as*5 is located between the light incident surface 41*as*1 and the corresponding one of the two bonding surfaces 41*as*3, and interconnects the light incident surface 41*as*1 and that bonding surface 41*as*3. The stepped portion 41*as*6 is located between the light incident surface 41*as*1 and the surface 41*as*4, and interconnects the light incident surface 41*as*1 and the surface 41*as*4. Each of the stepped portions 41*as*5 and the stepped portion 41*as*6 may be a plane, for example.

In the example shown in FIG. 4A, each stepped portion 41*as*5 is a surface extending in directions perpendicular to each of the light incident surface 41*as*1 and the bonding surfaces 41*as*3, but this is not limited thereto; it may be any surface extending in directions intersecting each of the light incident surface 41*as*1 and the bonding surfaces 41*as*3. The angle made by each stepped portion 41*as*5 and each of the light incident surface 41*as*1 and the bonding surfaces 41*as*3 may be not less than 80° and not more than 100°, for example. Similarly, in the example shown in FIG. 4A, the stepped portion 41*as*6 is a surface extending in directions perpendicular to each of the light incident surface 41*as*1 and the surface 41*as*4, but this is not limited thereto; it may be any surface extending in directions intersecting each of the light incident surface 41*as*1 and the surface 41*as*4. The angle made by the stepped portion 41*as*6 and each of the light incident surface 41*as*1 and the surface 41*as*4 may be not less than 80° and not more than 100°, for example. The height of each of the stepped portions 41*as*5 and the stepped portion 41*as*6 may be not less than 10 μm and not more than 1 mm, for example.

[Specific Relative Positioning of Components]

The positioning of the light-exiting surface 20*e* of the semiconductor laser element 20 and the surfaces of the supporting member 31A is as follows. In the example shown in FIG. 4A, the light-exiting surface 20*e* of the semiconductor laser element 20 is located rearward (i.e., in the −Z direction) of the first front end surfaces 31*as*1 and the second front end surface 31*as*2 of the supporting member 31A.

The positioning of the surfaces of the supporting member 31A and the front end surface 10*s*3 of the submount 10 is as follows. In the example shown in FIG. 4A, the first front end surfaces 31*as*1 and the second front end surface 31*as*2 of the supporting member 31A are located frontward (i.e., in the +Z direction) of the front end surface 10*s*3 of the submount 10.

The positioning of the surfaces of the lens member 41A and the surfaces of the supporting member 31A is as follows. In the example shown in FIG. 4B, the light incident surface 41*as*1 of the lens member 41A is located rearward (i.e., in the −Z direction) of the first front end surfaces 31*as*1 and the second front end surface 31*as*2 of the supporting member 31A. The light incident surface 41*as*1 of the lens member 41A does not face the first front end surfaces 31*as*1 and the second front end surface 31*as*2 of the supporting member 31A. The surface 41*as*4 of the lens member 41A faces the second front end surface 31*as*2 of the supporting member 31A. The bonding surfaces 41*as*3 of the lens member 41A face the first front end surfaces 31*as*1 of the supporting member 31A.

[Bonding of the Supporting Member 31A and the Lens Member 41A]

During the bonding of the supporting member 31A and the lens member 41A, the stepped portions 41*as*5 of the lens member 41A will serve as barriers to restrain portions of the dispersed metal paste from adhering to the light incident surface 41*as*1 of the lens member 41A or to the light-exiting surface 20*e* of the semiconductor laser element 20.

Thus, in the modified example of Embodiment 1, too, a laser light source 110A can be realized in which none or little of the metal paste is adhering to the light incident surface 41*as*1 of the lens member 41A or to the light-exiting surface 20*e* of the semiconductor laser element 20.

Embodiment 2

Figure 5A:
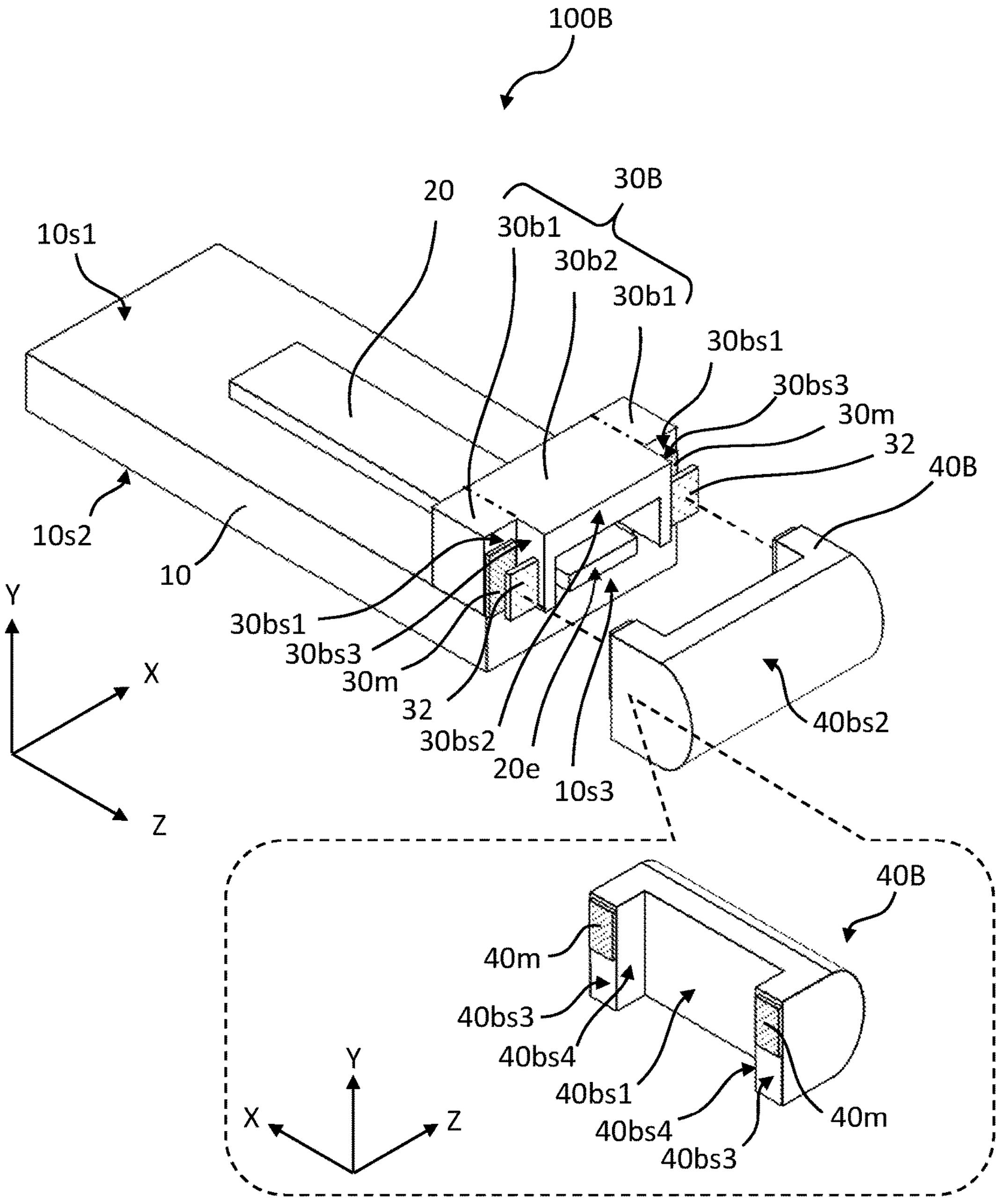
FIG. 5A is an exploded perspective view schematically showing the configuration of a laser light source according to illustrative Embodiment 2 of the present disclosure.
Figure 5B:
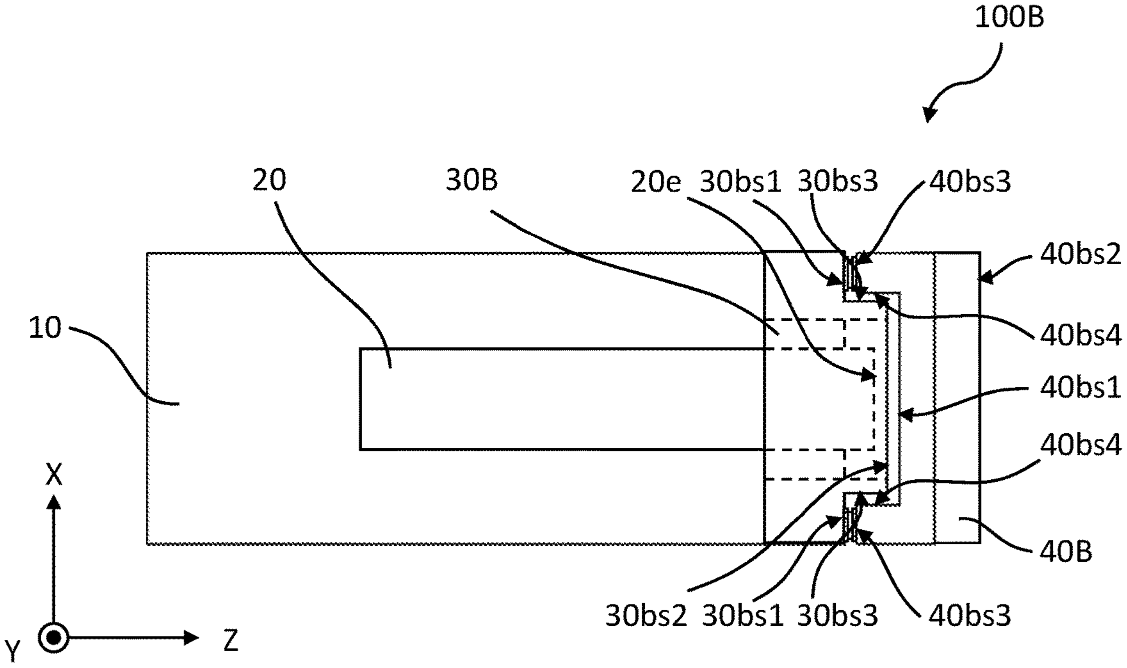
FIG. 5B is a top view of the laser light source shown in FIG. 5A.

Next, with reference to FIG. 5A and FIG. 5B, an example configuration of a laser light source according to Embodiment 2 will be described. FIG. 5A is an exploded perspective view schematically showing the configuration of a laser light source according to illustrative Embodiment 2 of the present disclosure. FIG. 5B is a top view of the laser light source shown in FIG. 5A. The laser light source 100B shown in FIG. 5A differs from the laser light source 100A shown in FIG. 2A with respect to the shapes of the supporting member 30B and the lens member 40B and the position at which the semiconductor laser element 20 is disposed. Hereinafter, mainly the differences between the laser light source 100B and the laser light source 100A will be described.

The supporting member 30B includes two support portions 30*b*1 and a linking portion 30*b*2 that links together the two support portions 30*b*1. The semiconductor laser element 20 is located between the two support portions 30*b*1. The supporting member 30B has a first front end surface 30*bs*1 in each of the two support portions 30*b*1, and has a second front end surface 30*bs*2 in the linking portion 30*b*2. Each first front end surface 30*bs*1 is a surface that supports the lens member 40B. The supporting member 30B may support the lens member 40B at both of the two first front end surfaces 30*bs*1, or support the lens member 40B at only one of the first front end surfaces 30*bs*1. Each of the first front end surfaces 30*bs*1 and the second front end surface 30*bs*2 may be a plane, for example. These two kinds of surfaces may be parallel to each other, for example. When the first front end surfaces 30*bs*1 are planes, the lens member 40B can be stably supported.

The supporting member 30B is shaped so that the second front end surface 30*bs*2 protrudes frontward (i.e., in the +Z direction) from the first front end surfaces 30*bs*1. Because of having this shape, the supporting member 30B includes two stepped portions 30*bs*3. Each of the two stepped portions 30*bs*3 is located between the corresponding one of the two first front end surfaces 30*bs*1 and the second front end surface 30*bs*2, and interconnects that first front end surface 30*bs*1 and the second front end surface 30*bs*2. The stepped surface 30*bs*3 may be a plane, for example. The height of the stepped surface 30*bs*3 may be not less than 10 μm and not more than 1 mm, for example.

The lens member 40B has a light incident surface 40*bs*1, a light-exiting surface 40*bs*2, and two bonding surfaces 40*bs*3 extending laterally from the light incident surface 40*bs*1. The lens member 40B is shaped so that the light incident surface 40*bs*1 is set back from the bonding surfaces 40*bs*3 in the frontward direction (i.e., in the +Z direction). The lens member 40B being shaped so as to be set back in the frontward direction (i.e., in the +Z direction) enables the supporting member 30B to have the frontward-protruding shape (i.e., protruding in the +Z direction). Because of having this shape, the lens member 40B includes two stepped portions 40*bs*4. Each of the two stepped portions 40*bs*4 is located between the light incident surface 40*bs*1 and one of the two bonding surfaces 40*bs*3, and interconnects the light incident surface 40*bs*1 and that bonding surface 40*bs*3. The stepped portions 40*bs*4 may be planes, for example.

In the example shown in FIG. 5A, each stepped portion 40*bs*4 is a surface extending in directions perpendicular to each of the light incident surface 40*bs*1 and the bonding surfaces 40*bs*3, but this is not thereto; it may be any surface extending in directions intersecting each of the light incident surface 40*bs*1 and the bonding surfaces 40*bs*3. The angle made by each stepped portion 40*bs*4 and each of the light incident surface 40*bs*1 and the bonding surfaces 40*bs*3 may be not less than 80° and not more than 100°, for example.

The height of each stepped portion 40*bs*4 may be not less than 10 μm and not more than 1 mm, for example.

[Specific Relative Positioning of Components]

The positioning of the light-exiting surface 20*e* of the semiconductor laser element 20 and the front end surface 10*s*3 of the submount 10 is as follows. In the example shown in FIG. 5A, the light-exiting surface 20*e* of the semiconductor laser element 20 is located frontward (i.e., in the +Z direction) of the front end surface 10*s*3 of the submount 10. Depending on the position of the focal point of the lens member 40B, the light-exiting surface 20*e* of the semiconductor laser element 20 may be located on the same plane as the front end surface 10*s*3 of the submount 10, or located rearward (i.e., in the −Z direction) of the front end surface 10*s*3.

The positioning of the light-exiting surface 20*e* of the semiconductor laser element 20 and the surfaces of the supporting member 30B is as follows. In the example shown in FIG. 5A, the light-exiting surface 20*e* of the semiconductor laser element 20 is located frontward (i.e., in the +Z direction) of the first front end surfaces 30*bs*1 of the supporting member 30B, and located rearward (i.e., in the −Z direction) of the second front end surface 30*bs*2. Depending on the position of the focal point of the lens member 40B, the light-exiting surface 20*e* of the semiconductor laser element 20 may be located on the same plane as the first front end surfaces 30*bs*1 of the supporting member 30B, or located rearward (i.e., in the −Z direction) of the first front end surfaces 30*bs*1.

The positioning of the surfaces of the supporting member 30B and the front end surface 10*s*3 of the submount 10 is as follows. In the example shown in FIG. 5A, the first front end surfaces 30*bs*1 of the supporting member 30B are located on the same plane as the front end surface 10*s*3 of the submount 10, and the second front end surface 30*bs*2 of the supporting member 30B is located frontward (i.e., in the +Z direction) of the front end surface 10*s*3 of the submount 10. The first front end surfaces 30*bs*1 may be located frontward (i.e., in the +Z direction) of the front end surface 10*s*3 of the submount 10, or located rearward (i.e., in the −Z direction) so long as the lens member 40B can be bonded thereto. In the case in which the first front end surfaces 30*bs*1 are located rearward (i.e., in the −Z direction) of the front end surface 10*s*3 of the submount 10, the distance between each first front end surface 30*bs*1 and the front end surface 10*s*3 of the submount 10 along the Z direction is equal to or less than a total of the thickness of the metal film 30*m* and the thickness of the inorganic bonding layer 32.

The positioning of the surfaces of the lens member 40B and the surfaces of the supporting member 30B is as follows. In the example shown in FIG. 5B, the light incident surface 40*bs*1 of the lens member 40B is located frontward (i.e., in the +Z direction) of the first front end surfaces 30*bs*1 of the supporting member 30B. The light incident surface 40*bs*1 of the lens member 40B faces the second front end surface 30*bs*2 of the supporting member 30B. The bonding surfaces 40*bs*3 of the lens member 40B face the first front end surfaces 30*bs*1 of the supporting member 30B. The stepped portions 40*bs*4 of the lens member 40B face the stepped portions 30*bs*3 of the supporting member 30B.

Bonding of the Supporting Member 30B and the Lens Member 40B

During the bonding of the supporting member 30B and the lens member 40B, the interspaces existing between the set-back portions of the lens member 40B and the protruding portions of the supporting member 30B facilitate the optical axis adjustment of the lens member 40B. In the example shown in FIG. 5B, interspaces exist between the light incident surface 40*bs*1 of the lens member 40B and the second front end surface 30*bs*2 of the supporting member 30B, and between the stepped portions 40*bs*4 of the lens member 40B and the stepped portions 30*bs*3 of the supporting member 30B. Therefore, the position of the lens member 40B can be finely adjusted by slightly shifting the lens member 40B along the X direction and/or the Z direction, or slightly rotating the lens member 40B around the Y axis as a rotation axis.

The range of the aforementioned interspaces that allows for such fine adjustments is as follows. The interspace between the light incident surface 40*bs*1 of the lens member 40B and the second front end surface 30*bs*2 of the supporting member 30B may be not less than 5 μm and not more than 500 μm, for example. The interspace between the stepped portion 40*bs*4 of the lens member 40B and the corresponding stepped portion 30*bs*3 of the supporting member 30B may be not less than 5 μm and not more than 500 μm, for example.

Furthermore, during the bonding of the supporting member 30B and the lens member 40B, the stepped portions 30*bs*3 of the supporting member 30B serve as barriers to restrain portions of the dispersed metal paste from adhering to the light incident surface 40*bs*1 of the lens member 40B or to the light-exiting surface 20*e* of the semiconductor laser element 20. When the height of the stepped portions 30*bs*3 of the supporting member 30B is in the aforementioned range of values, such adhesion of portions of the metal paste can be effectively restrained.

Thus, in Embodiment 2, too, a laser light source 100B can be realized in which none or little of the metal paste is adhering to the light incident surface 40*bs*1 of the lens member 40B or to the light-exiting surface 20*e* of the semiconductor laser element 20.

Modified Example of Embodiment 2

Figure 6A:
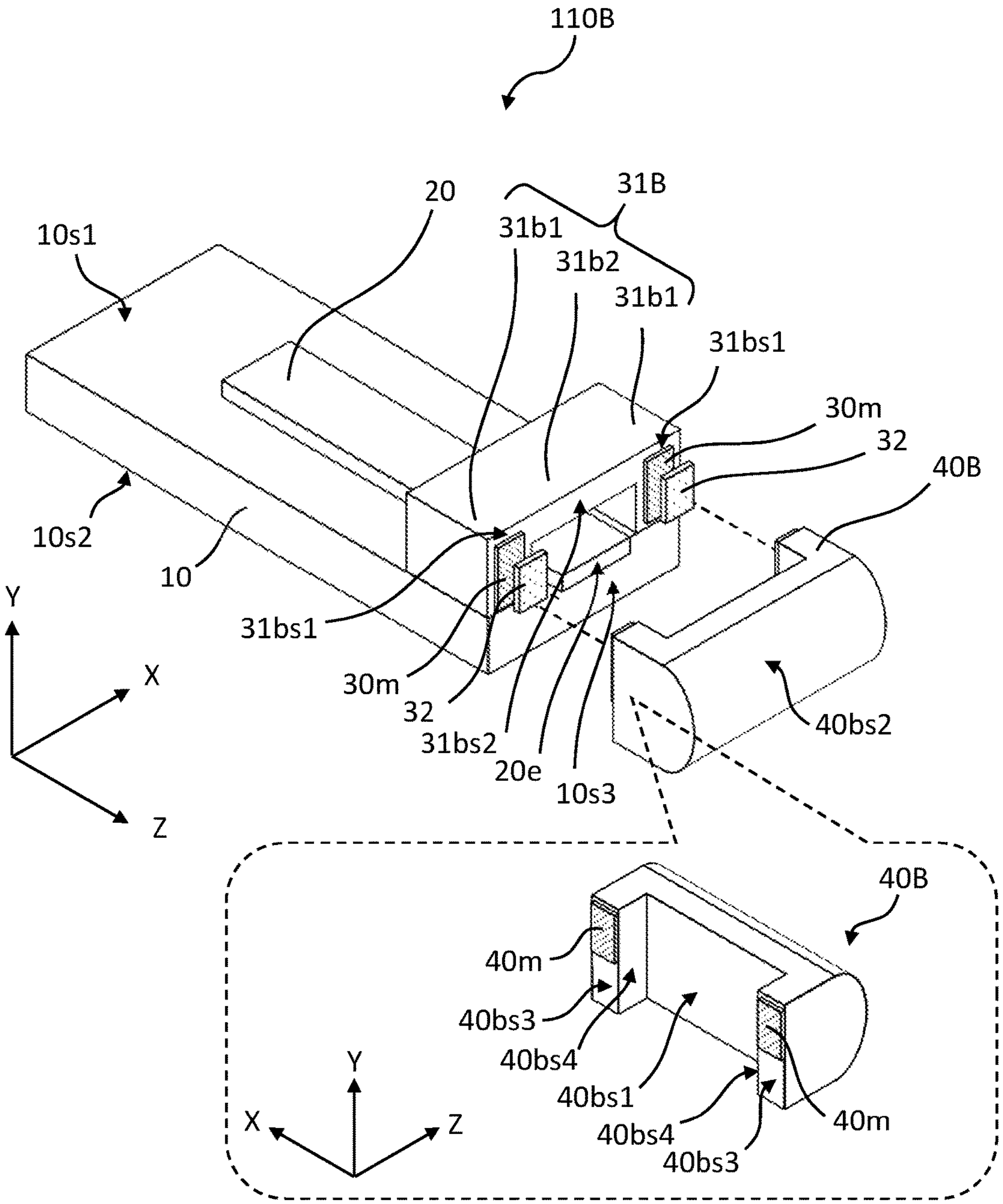
FIG. 6A is an exploded perspective view schematically showing a modified example of the laser light source according to Embodiment 2.
Figure 6B:
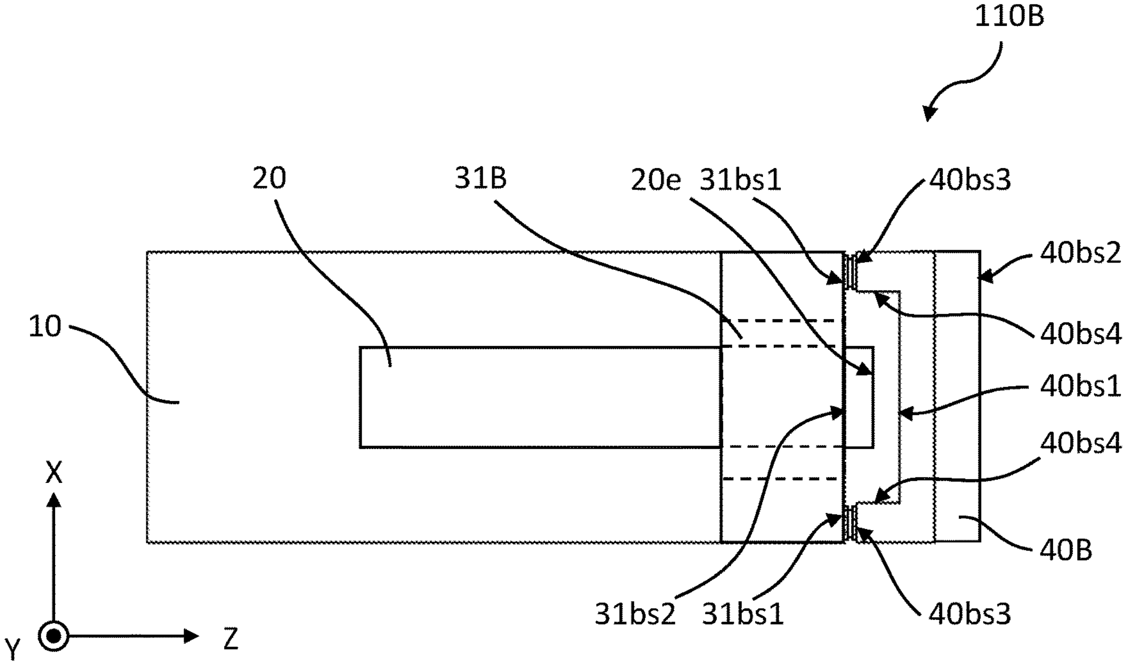
FIG. 6B is a top view of the laser light source shown in FIG. 6A.

Next, with reference to FIG. 6A and FIG. 6B, a modified example of the laser light source 100B according to Embodiment 2 will be described. FIG. 6A is an exploded perspective view schematically showing a modified example of the laser light source according to Embodiment 2. FIG. 6B is a top view of the laser light source shown in FIG. 6A. The laser light source 110B shown in FIG. 6A differs from the laser light source 100B shown in FIG. 5A with respect to the shape of the supporting member 31B. The supporting member 31B is similar in structure to the supporting member 31A shown in FIG. 4A. The two support portions 31*b*1 and the linking portion 31*b*2 of the supporting member 31B respectively correspond to the two support portions 31*a*1 and the linking portion 31*a*2 of the supporting member 31A. The first front end surfaces 31*bs*1 and the second front end surface 31*bs*2 of the supporting member 31B respectively correspond to the first front end surfaces 31*as*1 and the second front end surface 31*as*2 of the supporting member 31A. Hereinafter, mainly the differences between the laser light source 110B and the laser light source 100B will be described.

Specific Relative Positioning of Components

The positioning of the light-exiting surface 20*e* of the semiconductor laser element 20 and the surfaces of the supporting member 31B is as follows. In the example shown in FIG. 6A, the light-exiting surface 20*e* of the semiconductor laser element 20 is located frontward (i.e., in the +Z direction) of the first front end surfaces 31*bs*1 and the second front end surface 31*bs*2 of the supporting member 31B.

The positioning of the light-exiting surface 20*e* of the semiconductor laser element 20 and the surfaces of the lens member 40B is as follows. In the example shown in FIG. 6B, the light-exiting surface 20*e* of the semiconductor laser element 20 is located frontward (i.e., in the +Z direction) of the bonding surfaces 40*bs*3 of the lens member 40B.

The positioning of the surfaces of the supporting member 31B and the front end surface 10*s*3 of the submount 10 is as follows. In the example shown in FIG. 6A, the first front end surfaces 31*bs*1 and the second front end surface 31*bs*2 of the supporting member 31B are located on the same plane as the front end surface 10*s*3 of the submount 10. The first front end surfaces 31*bs*1 and the second front end surface 31*bs*2 of the supporting member 31B may be located frontward (i.e., in the +Z direction) of the front end surface 10*s*3 of the submount 10, or located rearward (i.e., in the −Z direction) of the front end surface 10*s*3 of the submount 10 so long as the lens member 40B can be bonded thereto.

Bonding of the Supporting Member 31B and the Lens Member 40B

During the bonding of the supporting member 31B and the lens member 40B, as viewed from the front (the +Z direction), all of the metal paste overlaps the first front end surfaces 31*bs*1 of the supporting member 31B and the bonding surfaces 40*bs*3 of the lens member 40B. In other words, no portion of the metal paste protrudes out of these two kinds of surfaces. In this state, even if bumping of the organic binder causes portions of the metal paste to disperse into the air, most of them will disperse in perpendicular directions to the Z direction. Therefore, even though the second front end surface 31*bs*2 of the supporting member 31B may not be located frontward (i.e., in the +Z direction) of the first front end surfaces 31*bs*1 like in Embodiment 2, it is still possible to restrain portions of the dispersed metal paste from adhering to the light incident surface 40*bs*1 of the lens member 40B or to the light-exiting surface 20*e* of the semiconductor laser element 20. The reason for this is that the light incident surface 40*bs*1 of the lens member 40B and the light-exiting surface 20*e* of the semiconductor laser element 20 are located frontward (i.e. in the +Z direction) of the bonding surfaces 40*bs*3 of the lens member 40B. At worst, portions of the metal paste may only adhere to the lateral surfaces of the semiconductor laser element 20.

Thus, in the modified example of Embodiment 2, too, a laser light source 110B can be realized in which none or little of the metal paste is adhering to the light incident surface 40*bs*1 of the lens member 40B or to the light-exiting surface 20*e* of the semiconductor laser element 20.

Embodiment 3

Figure 7A:
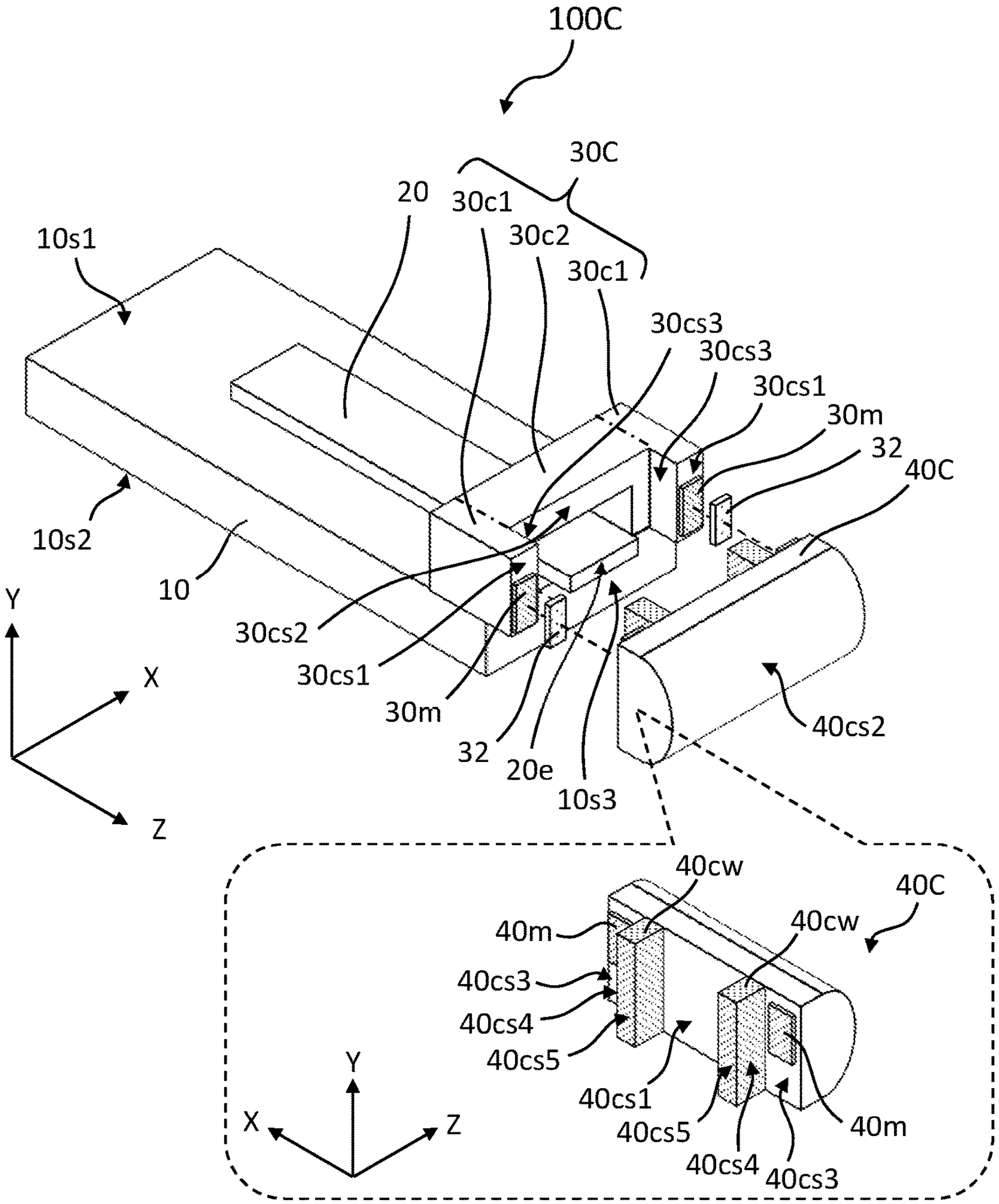
FIG. 7A is an exploded perspective view schematically showing the configuration of a laser light source according to illustrative Embodiment 3 of the present disclosure.
Figure 7B:
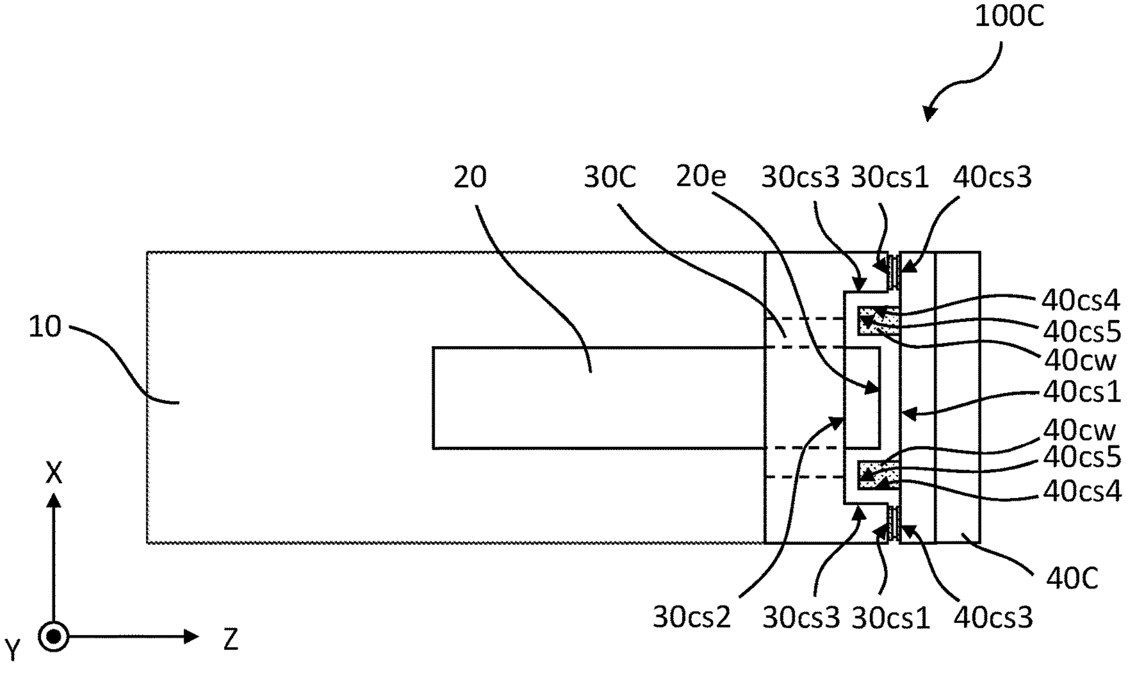
FIG. 7B is a top view of the laser light source shown in FIG. 7A.

Next, with reference to FIG. 7A and FIG. 7B, an example configuration of a laser light source according to Embodiment 3 will be described. FIG. 7A is an exploded perspective view schematically showing the configuration of a laser light source according to illustrative Embodiment 3 of the present disclosure. FIG. 7B is a top view of the laser light source shown in FIG. 7A. The laser light source 100C shown in FIG. 7A differs from the laser light source 100A shown in FIG. 2A with respect to the shape and material of the lens member 40C and the position at which the semiconductor laser element 20 is disposed. The supporting member 30C is similar in structure to the supporting member 30A shown in FIG. 2A. The two support portions 30*c*1 and the linking portion 30*c*2 of the supporting member 30C respectively correspond to the two support portions 30*a*1 and the linking portion 30*a*2 of the supporting member 30A. The first front end surfaces 30*cs*1, the second front end surface 30*cs*2, and the stepped portions 30*cs*3 of the supporting member 30C respectively correspond to the first front end surfaces 30*as*1, the second front end surface 30*as*2, and the stepped portions 30*as*3 of the supporting member 30A. Hereinafter, mainly the differences between the laser light source 100C and the laser light source 100A will be described.

The lens member 40C includes a light incident surface 40*cs*1, a light-exiting surface 40*cs*2, and two bonding surfaces 40*cs*3 extending laterally from the light incident surface 40*cs*1. The light incident surface 40*cs*1 and the bonding surfaces 40*cs*3 are located on the same plane. The lens member 40C includes two walls 40*cw* protruding rearward (i.e., in the −Z direction). Each of the two walls 40*cw* is located between the light incident surface 40*cs*1 and the corresponding one of the two bonding surfaces 40*cs*3. Each wall 40*cw* has an outer wall surface 40*cs*4 that is located outward, and a protruding surface 40*cs*5 protruding rearward (i.e., in the −Z direction) from the light incident surface 40*cs*1 and the bonding surface 40*cs*3. In other words, the lens member 40C has one outer wall surface 40*cs*4 in each of the two walls 40*cw*, and one protruding surface 40*cs*5 in each of the two walls 40*cw*. Each of the outer wall surfaces 40*cs*4 and the protruding surfaces 40*cs*5 may be a plane, for example. The protruding surfaces 40*cs*5 may be parallel to each of the light incident surface 40*cs*1 and the bonding surfaces 40*cs*3, for example. Each of the two outer wall surfaces 40*cs*4 is located between the light incident surface 40*cs*1 and the corresponding one of the two bonding surfaces 40*cs*3.

In the example shown in FIG. 7A, each outer wall surface 40*cs*4 of each wall 40*cw* is a surface extending in directions perpendicular to each of the light incident surface 40*cs*1 and the bonding surfaces 40*cs*3, but this is not limited thereto; it may be any surface extending in directions intersecting each of the light incident surface 40*cs*1 and the bonding surfaces 40*cs*3. The angle made by each outer wall surface 40*cs*4 of each wall 40*cw* and each of the light incident surface 40*cs*1 and the bonding surfaces 40*cs*3 may be not less than 80° and not more than 100°, for example.

For instance, the walls 40*cw* may be formed of a ceramic or a metal as follows, for example. First, an intermediate product is provided that includes a metal film formed between the light incident surface 40*cs*1 and the bonding surfaces 40*cs*3, the metal film extending along the Y direction. Next, the intermediate product is immersed in a solution containing electrically-charged ceramic particles, and an electric current is flowed between the solution and the intermediate product to electrodeposit the electrically-charged ceramic particles onto the metal film, whereby the walls 40*cw* being composed of the ceramic are produced. Alternatively, the intermediate product may be immersed in a plating solution, and an electric current is flowed between the plating solution and the intermediate product, whereby the walls 40*cw* being composed of the metal are produced.

Portions of the lens member 40C other than the walls 40*cw* and the metal films 40*m* may be formed of a light-transmissive material, for example. The lens member 40C can be produced more easily if the walls 40*cw* are formed of a ceramic or a metal and the other portions are formed of a light-transmissive material, than if the walls 40*cw* and the other portions are both formed of a light-transmissive material. In the case in which the walls 40*cw* and the other portions are both formed of a light-transmissive material, the light-transmissive material in dissolved form is placed in a mold and cooled. This may cause air bubbles to be mixed into the lens member 40C because of its complicated shape.

If this possibility needs no consideration, then the walls 40*cw* and the other portions may both be formed of a light-transmissive member.

Even when a portion of laser light emitted from the semiconductor laser element 20 is incident on the walls 40*cw* being composed of a ceramic or a metal, the walls 40*cw* will reflect that portion of laser light; therefore, the portion of laser light is less likely to reach the inorganic bonding layers 32. This allows for restraining the inorganic bonding layers 32 from being further sintered and shrinking due to laser light irradiation. Accordingly, the lens member 40C will be able to accurately collimate the laser light emitted from the semiconductor laser element 20 over long periods of use.

The height (i.e., dimension along the Z direction), the width (i.e., dimension along the Y direction), and the thickness (i.e., dimension along the X direction) of the walls 40*cw* are as follows. The height of the walls 40*cw* may be not less than 10 μm and not more than 1 mm, for example. The width of the walls 40*cw* may be not less than 50 μm and not more than 500 μm, for example. The thickness of the walls 40*cw* may be not less than 5 μm and not more than 200 μm, for example.

In the example shown in FIG. 7A, the width of the walls 40*cw* is equal to the dimension of the lens member 40C along the Y direction. So long as portions of the dispersed metal paste are restrained from adhering to the light incident surface 40*cs*1 of the lens member 40C, the width of the walls 40*cw* may be smaller than the dimension of the lens member 40C along the Y direction.

[Specific Relative Positioning of Components]

The positioning of the light-exiting surface 20*e* of the semiconductor laser element 20 and the front end surface 10*s*3 of the submount 10 is as follows. In the example shown in FIG. 7A, the light-exiting surface 20*e* of the semiconductor laser element 20 is located frontward of the front end surface 10*s*3 of the submount 10. Depending on the position of the focal point of the lens member 40C, the light-exiting surface 20*e* of the semiconductor laser element 20 may be located on the same plane as the front end surface 10*s*3 of the submount 10, or located rearward (i.e., in the −Z direction) of the front end surface 10*s*3.

The positioning of the light-exiting surface 20*e* of the semiconductor laser element 20 and the surfaces of the supporting member 30C is as follows. In the example shown in FIG. 7B, the light-exiting surface 20*e* of the semiconductor laser element 20 is located frontward of the second front end surface 30*cs*2 of the supporting member 30C, and is located rearward (i.e., in the −Z direction) of the first front end surfaces 30*cs*1 of the supporting member 30C. The light-exiting surface 20*e* of the semiconductor laser element 20 may be located rearward (i.e., in the −Z direction) of the second front end surface 30*cs*2.

The positioning of the light-exiting surface 20*e* of the semiconductor laser element 20 and the walls 40*cw* and the surfaces of the lens member 40C is as follows. The light-exiting surface 20*e* of the semiconductor laser element 20 is located between the two walls 40*cw*. The light-exiting surface 20*e* of the semiconductor laser element 20 is located frontward (i.e., in the +Z direction) of the protruding surfaces 40*cs*5. Depending on the position of the focal point of the lens member 40C, the light-exiting surface 20*e* of the semiconductor laser element 20 may be located rearward (i.e., in the −Z direction) of the protruding surfaces 40*cs*5 of the lens member 40C.

The positioning of the surfaces of the lens member 40C and the surfaces of the supporting member 30C is as follows. As shown in FIG. 7B, the protruding surfaces 40*cs*5 of the lens member 40C are located rearward (i.e., in the −Z direction) of the first front end surfaces 30*cs*1 of the supporting member 30C. The protruding surfaces 40*cs*5 of the lens member 40C face the second front end surface 30*cs*2 of the supporting member 30C. The bonding surfaces 40*cs*3 of the lens member 40C face the first front end surfaces 30*cs*1 of the supporting member 30C. The outer wall surfaces 40*cs*4 of the lens member 40C face the stepped portions 30*cs*3 of the supporting member 30C.

[Bonding of the Supporting Member 30C and the Lens Member 40C]

During the bonding of the supporting member 30C and the lens member 40C, the interspaces existing between the walls 40*cw* of the lens member 40C and the set-back portions of the supporting member 30C facilitate the optical axis adjustment of the lens member 40C. In the example shown in FIG. 7B, interspaces exist between the protruding surfaces 40*cs*5 of the lens member 40C and the second front end surface 30*cs*2 of the supporting member 30C, and between the outer wall surfaces 40*cs*4 of the lens member 40C and the stepped portions 30*cs*3 of the supporting member 30C. Therefore, the position of the lens member 40C can be finely adjusted by slightly shifting the lens member 40C along the X direction and/or the Z direction, or slightly rotating the lens member 40C around the Y axis as a rotation axis.

The range of the aforementioned interspaces enabling such fine adjustments is as follows. The interspace between the protruding surface 40*cs*5 of the lens member 40C and the second front end surface 30*cs*2 of the supporting member 30C may be not less than 5 μm and not more than 500 μm, for example. The interspace between the outer wall surface 40*cs*4 of the lens member 40C and the corresponding stepped portion 30*cs*3 of the supporting member 30C may be not less than 5 μm and not more than 500 μm, for example.

Furthermore, during the bonding of the supporting member 30C and the lens member 40C, the outer wall surfaces 40*cs*4 of the lens member 40C serve as barriers to restrain portions of the dispersed metal paste from adhering to the light incident surface 40*cs*1 of the lens member 40C or to the light-exiting surface 20*e* of the semiconductor laser element 20. Adhesion of portions of the dispersed metal paste to the light-exiting surface 20*e* of the semiconductor laser element 20 can be more effectively restrained if the light-exiting surface 20*e* of the semiconductor laser element 20 is located frontward (i.e., in the +Z direction), than if located rearward (i.e., in the −Z direction), of the protruding surfaces 40*cs*5.

When the height, width, and thickness of the walls 40*cw* are too small, portions of the metal paste may leap over the outer wall surfaces 40*cs*4 to adhere to the light incident surface 40*cs*1 of the lens member 40C and/or the light-exiting surface 20*e* of the semiconductor laser element 20. When the height, width, and thickness of the walls 40*cw* are in the aforementioned ranges of values, such adhesion of portions of the metal paste can be effectively restrained.

Thus, in Embodiment 3, too, a laser light source 100C can be realized in which none or little of the metal paste is adhering to the light incident surface 40*cs*1 of the lens member 40C or to the light-exiting surface 20*e* of the semiconductor laser element 20.

Embodiment 4

Figure 8A:
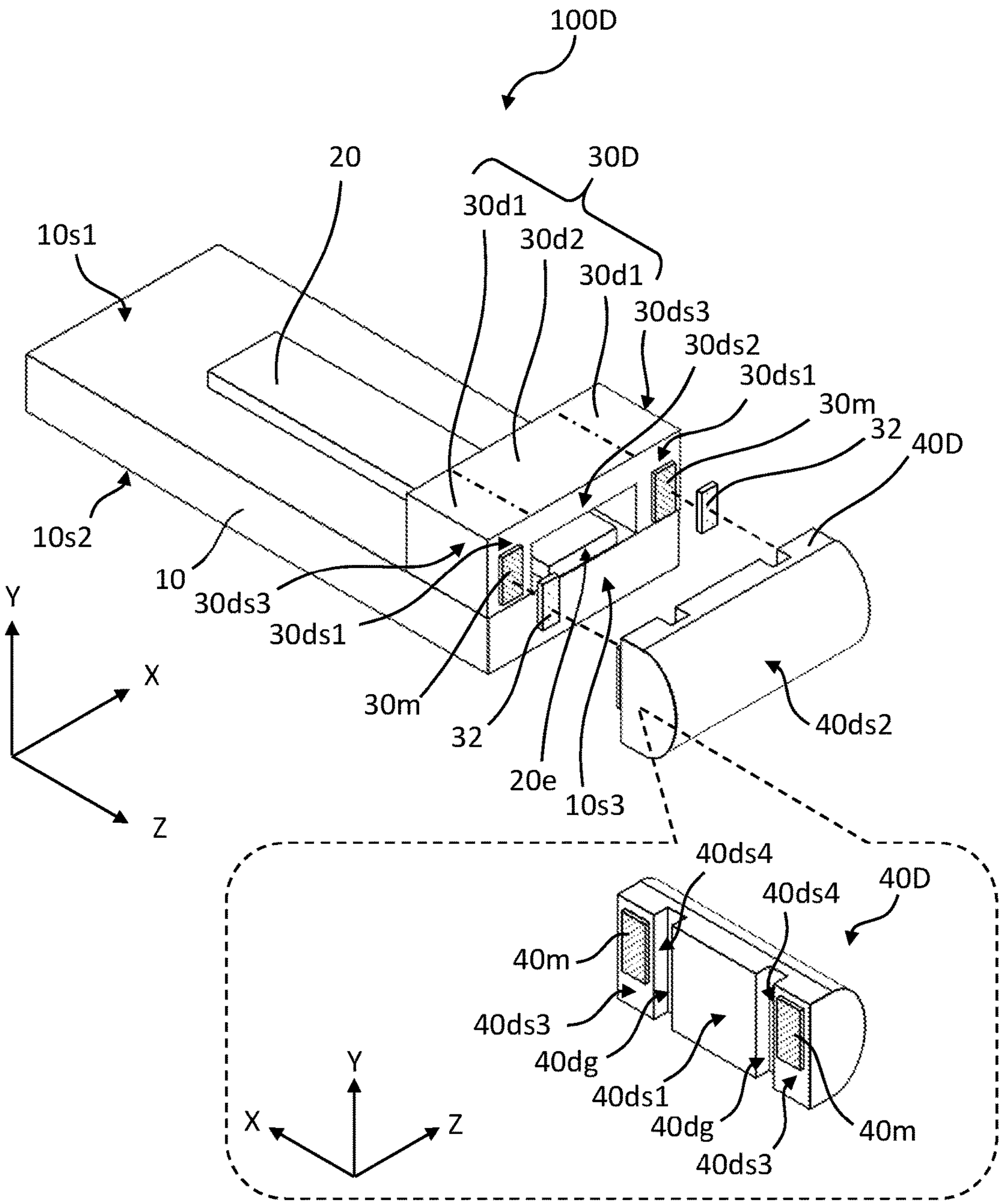
FIG. 8A is an exploded perspective view schematically showing the configuration of a laser light source according to illustrative Embodiment 4 of the present disclosure.
Figure 8B:
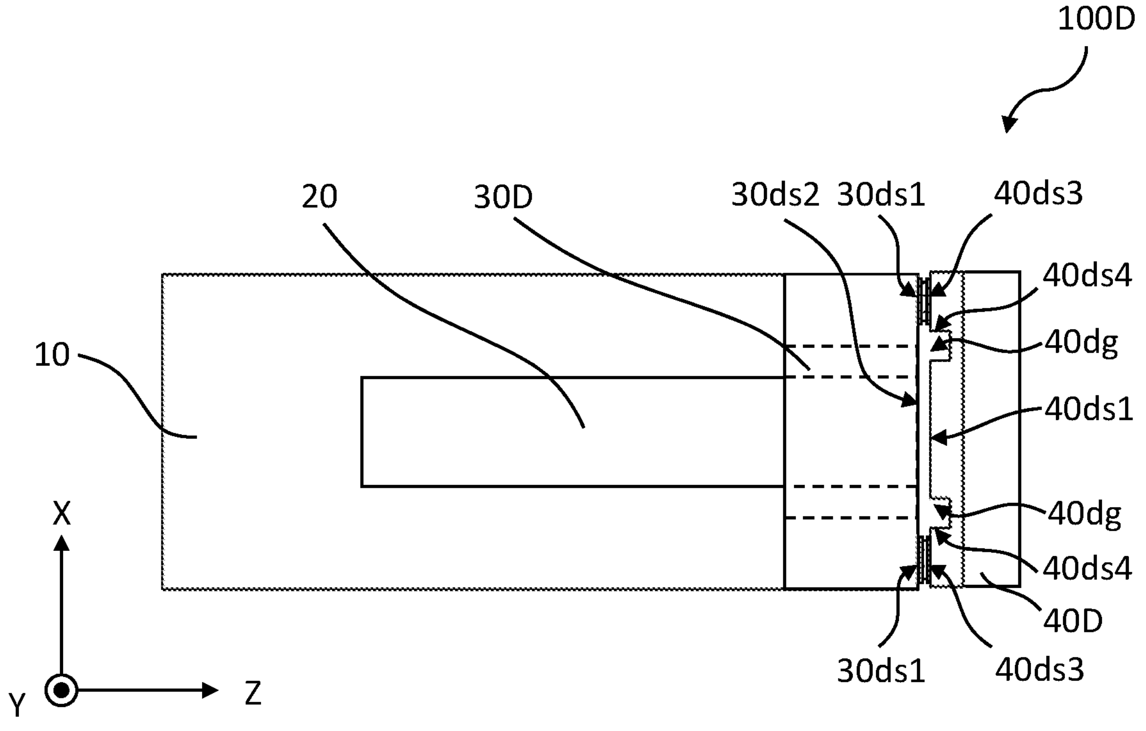
FIG. 8B is a top view of the laser light source shown in FIG. 8A.

Next, with reference to FIG. 8A and FIG. 8B, an example configuration of a laser light source according to Embodiment 4 will be described. FIG. 8A is an exploded perspective view schematically showing the configuration of a laser light source according to illustrative Embodiment 4 of the present disclosure. FIG. 8B is a top view of the laser light source shown in FIG. 8A. The laser light source 100D shown in FIG. 8A differs from the laser light source 100A shown in FIG. 2A with respect to the shapes of the supporting member 30D and the lens member 40D. The supporting member 30D is similar in structure to the supporting member 31A shown in FIG. 4A. The two support portions 30*d*1 and the linking portion 30*d*2 of the supporting member 30D respectively correspond to the two support portions 31*a*1 and the linking portion 31*a*2 of the supporting member 31A. The first front end surfaces 30*ds*1 and the second front end surface 30*ds*2 of the supporting member 30D respectively correspond to the first front end surfaces 31*as*1 and the second front end surface 31*as*2 of the supporting member 31A. The supporting member 30D has two outer lateral surfaces 30*ds*3 to be irradiated with laser light for heating purposes (although description regarding this was omitted with respect to the supporting member 31A). Hereinafter, mainly the differences between the laser light source 100D and the laser light source 100A will be described.

The lens member 40D has a light incident surface 40*ds*1, a light-exiting surface 40*ds*2, and two bonding surfaces 40*ds*3 extending laterally from the light incident surface 40*ds*1. The light incident surface 40*ds*1 and the bonding surfaces 40*ds*3 are located on the same plane. The lens member 40D includes two grooves 40*dg*. Each of the two grooves 40*dg* is located between the light incident surface 40*ds*1 and the corresponding one of the two bonding surfaces 40*ds*3. As viewed from the front (the +Z direction), the semiconductor laser element 20 is located between the two grooves 40*dg*, and therefore does not overlap the two grooves 40*dg*. On each of the two grooves 40*dg*, the lens member 40D has a lateral surface 40*ds*4 that is located outward. The lateral surfaces 40*ds*4 may be planes, for example. Each of the two lateral surfaces 40*ds*4 is located between the light incident surface 40*ds*1 and the corresponding one of the two bonding surfaces 40*ds*3.

In the example shown in FIG. 8A, each lateral surface 40*ds*4 is a surface extending in directions perpendicular to each of the light incident surface 40*ds*1 and the bonding surfaces 40*ds*3, but this is not limited thereto; it may be any surface extending in directions intersecting each of the light incident surface 40*ds*1 and the bonding surfaces 40*ds*3. The angle made by each lateral surface 40*ds*4 of each groove 40*dg* and each of the light incident surface 40*ds*1 and the bonding surfaces 40*ds*3 may be not less than 80° and not more than 100°, for example. The depth (i.e., dimension along the Z direction) of each groove 40*dg* may be not less than 10 μm and not more than 200 μm, for example. The width (i.e., dimension along the X direction) of each groove 40*dg* may be not less than 5 μm and not more than 200 μm, for example. The grooves 40*dg* may be formed by using a diamond blade, for example.

Specific Relative Positioning of Components

The positioning of the surfaces of the supporting member 30D and the front end surface 10*s*3 of the submount 10 is as follows. In the example shown in FIG. 8A, the first front end surfaces 30*ds*1 and the second front end surface 30*ds*2 of the supporting member 30D are located on the same plane as the front end surface 10*s*3 of the submount 10. The first front end surfaces 30*ds*1 and the second front end surface 30*ds*2 may be located frontward (i.e., in the +Z direction) of the front end surface 10*s*3, or located rearward (i.e., in the −Z direction) of the front end surface 10*s*3 so long as the lens member 40D can be bonded thereto.

The positioning of the surfaces of the lens member 40D and the surfaces of the supporting member 30D is as follows. In the example shown in FIG. 8B, the light incident surface 40*ds*1 of the lens member 40D faces the second front end surface 30*ds*2 of the supporting member 30D. The bonding surfaces 40*ds*3 of the lens member 40D face the first front end surfaces 30*ds*1 of the supporting member 30D.

Bonding of the Supporting Member 30D and the Lens Member 40D

Figure 9:
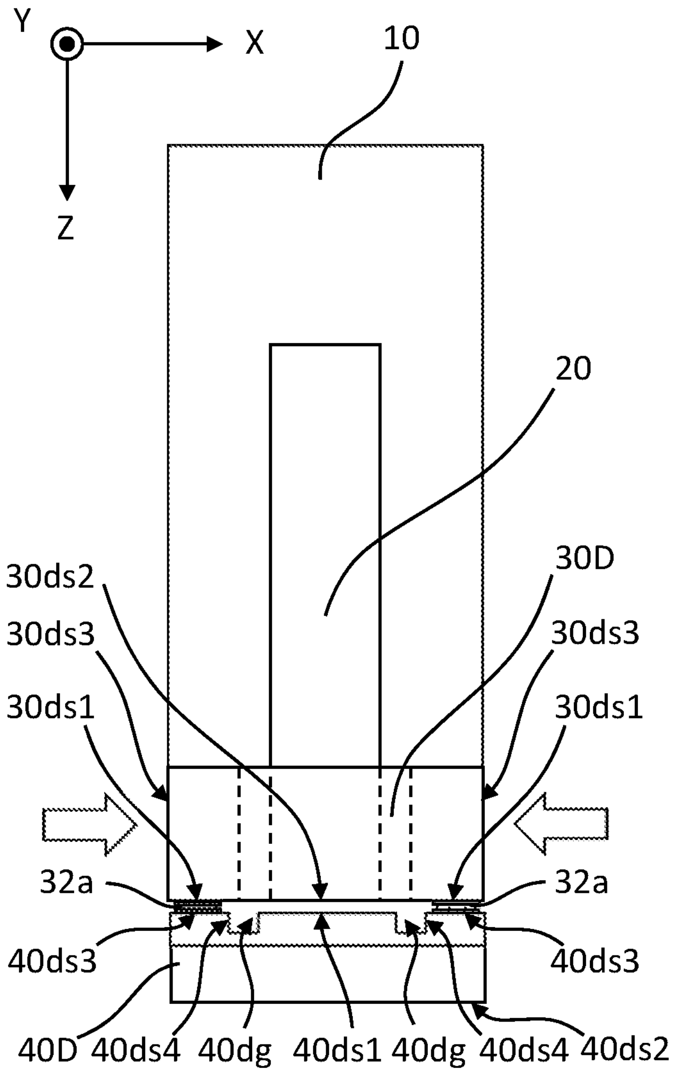
FIG. 9 is a top view for illustrating the method of bonding a supporting member and a lens member according to Embodiment 4.

Next, with reference to FIG. 9, a method of bonding the supporting member 30D and the lens member 40D will be described. FIG. 9 is a top view for describing the method of bonding the supporting member 30D and the lens member 40D according to Embodiment 4. In the example shown in FIG. 9, the +Z direction is the direction in which gravity acts (hereinafter “the direction of gravity”). Blank arrows indicate directions in which laser light for heating purposes is radiated.

As shown in FIG. 9, the submount 10, with the semiconductor laser element 20 and the supporting member 30D connected thereto, and the lens member 40D, are disposed so that the bonding surfaces 40*ds*3 of the lens member 40D and the first front end surfaces 30*ds*1 of the supporting member 30D are in contact with each other via the metal paste 32*a*. The light-exiting surface 40*ds*2 of the lens member 40D faces in the direction of gravity. When the following two conditions are met, portions of the dispersed metal paste tend to disperse along the bonding surfaces 40*ds*3, rather than into the air. The first condition is that the power density of the laser light for heating purposes is not very high, e.g., not less than 15 W/cm$^2$ and not more than 50 W/cm$^2$. The second condition is that all of the metal paste 32*a* overlaps the first front end surfaces 30*ds*1 of the supporting member 30D and the bonding surfaces 40*ds*3 of the lens member 40D, as viewed from the front (the +Z direction), i.e., no portion of the metal paste 32*a* protrudes from these two surfaces.

When the above two conditions are met by the intermediate product shown in FIG. 9, portions of the metal paste dispersed along the bonding surfaces 40*ds*3 may fall into the grooves 40*dg* of the lens member 40D, due to gravity. This can restrain portions of the dispersed metal paste from adhering to the light incident surface 40*ds*1 of the lens member 40D.

If the depth of the grooves 40*dg* is too small, the grooves 40*dg* may be filled with part of the metal paste. This may possibly cause portions of the metal paste to adhere to the light incident surface 40*ds*1 of the lens member 40D. When the depth of each groove 40*dg* is in the aforementioned range of values, such adhesion of portions of the metal paste can be effectively restrained.

In the example shown in FIG. 9, the lens member 40D has one groove 40*dg* between the light incident surface 40*ds*1 and each bonding surface 40*ds*3; however, has more than one groove 40*dg*. In the case in which the lens member 40D has M grooves 40*dg* (where M is a natural number of 2 or greater), it does not matter if up to N$^{th}$ (where N is a natural number of M−1 or smaller) grooves 40*dg* from the closest one to the bonding surfaces 40*ds*3 are all filled with part of the metal paste. The reason is that part of the metal paste that falls into the N+1$^{th}$ groove 40*dg* will serve to restrain portions of the metal paste from adhering to the light incident surface 40*ds*1 of the lens member 40D. Within the aforementioned range of values, the multiple grooves 40*dg* may be all equal in depth, all different in depth, or only some of them may differ in depth while others are equal. The same is also true of the widths of the multiple grooves 40*dg*.

Thus, in Embodiment 4, too, a laser light source 100D can be realized in which none or little of the metal paste is adhering to the light incident surface 40*ds*1 of the lens member 40D or to the light-exiting surface 20*e* of the semiconductor laser element 20.

The method of bonding the supporting member 30D and the lens member 40D in Embodiment 4 may be applied to the method of bonding the supporting member and the lens member in the aforementioned embodiments. In the example shown in FIG. 2B, the supporting member 30A and the lens member 40A may be bonded together with the light-exiting surface 40*as*2 of the lens member 40A facing in the direction of gravity. In that case, due to gravity, portions of the metal paste dispersed along the bonding surfaces 40*as*3 are restrained from rising onto the stepped portions 40*as*4 and adhering to the light incident surface 40*as*1. The same is also true of the examples illustrated in FIG. 4B and FIG. 7B.

In the example shown in FIG. 5B, the supporting member 30B and the lens member 40B may be bonded together, with the light-exiting surface 40*bs*2 of the lens member 40B facing in the direction opposite to the direction of gravity. In that case, due to gravity, portions of the dispersed metal paste along the bonding surfaces 40*bs*3 are restrained from rising onto the stepped surface 40*bs*4 and adhering to the light incident surface 40*bs*1. The same is also true of the example illustrated in FIG. 6B.

Embodiment 5

Figure 10:
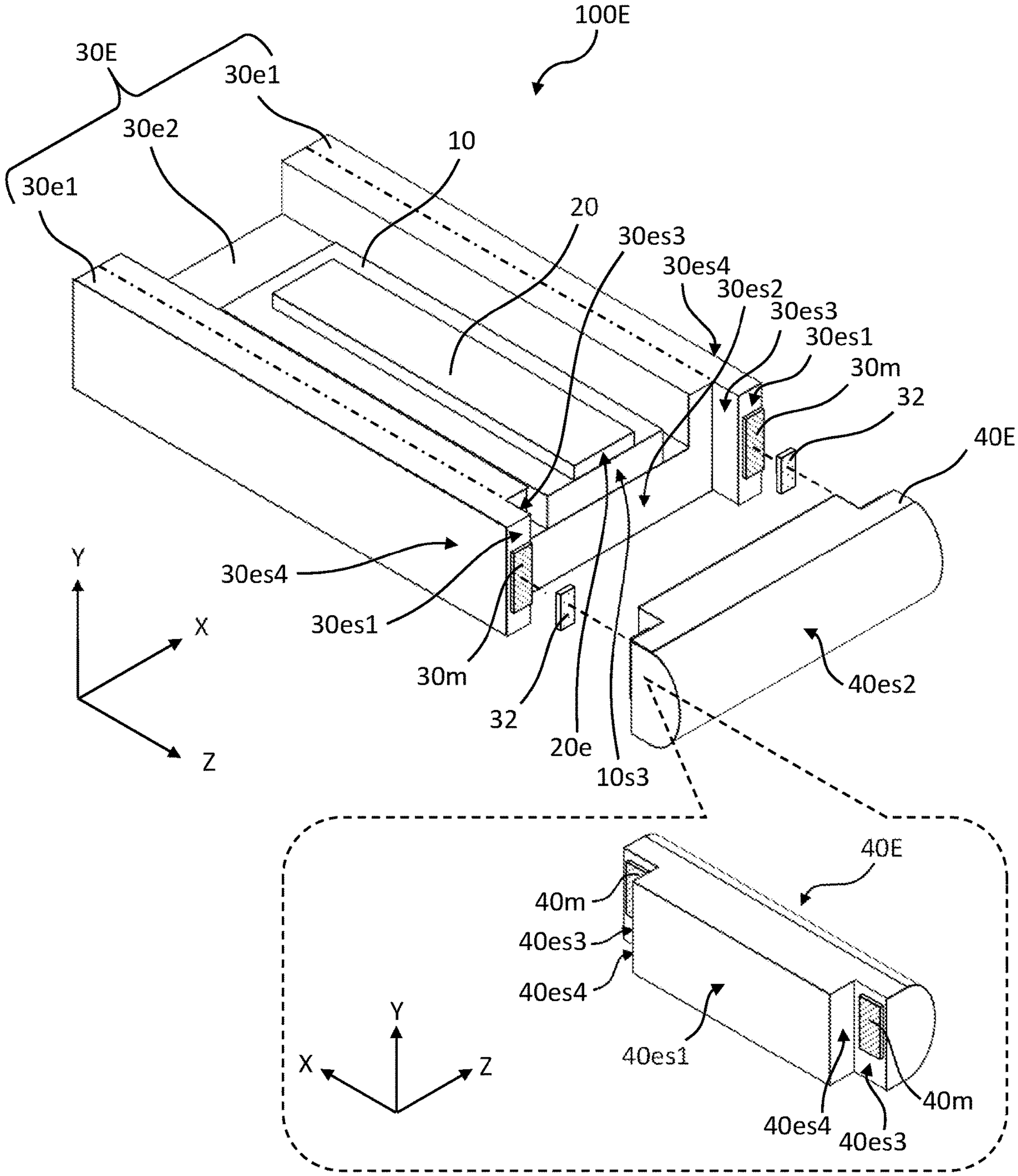
FIG. 10 is an exploded perspective view schematically showing the configuration of a laser light source according to illustrative Embodiment 5 of the present disclosure.

Next, with reference to FIG. 10, an example configuration of a laser light source according to Embodiment 5 will be described. FIG. 10 is an exploded perspective view schematically showing the configuration of a laser light source according to illustrative Embodiment 5 of the present disclosure. The laser light source 100E shown in FIG. 10 differs from the laser light source 100A shown in FIG. 2A in that the supporting member 30E connecting together the lens member 40E and the submount 10 supports not only the lens member 40E but also the submount 10. The lens member 40E is similar in structure to the lens member 40A shown in FIG. 2A. The light incident surface 40*es*1, the light-exiting surface 40*es*2, the bonding surfaces 40*es*3, and the stepped portions 40*es*4 of the lens member 40E respectively correspond to the light incident surface 40*as*1, the light-exiting surface 40*as*2, the bonding surfaces 40*as*3, and the stepped portions 40*as*4 of the lens member 40A. Hereinafter, mainly the differences between the laser light source 100E and the laser light source 100A will be described.

The supporting member 30E includes two support portions 30*e*1 and a linking portion 30*e*2 that links together the two support portions 30*e*1. The submount 10 and the semiconductor laser element 20 are located between the two support portions 30*e*1. The two support portions 30*e*1 supports the lens member 40E, while the linking portion 30*e*2 supports the submount 10. The supporting member 30E, the submount 10, and the semiconductor laser element 20 are arranged in this order along the Y direction.

The supporting member 30E has a first front end surface 30*es*1 in each of the two support portions 30*e*1, and has a second front end surface 30*es*2 in the linking portion 30*e*2. Each first front end surface 30*es*1 is a surface that supports the lens member 40E. The supporting member 30E may support the lens member 40E at both of the two first front end surfaces 30*es*1, or support the lens member 40E at only one of the first front end surfaces 30*es*1. Each of the first front end surfaces 30*es*1 and the second front end surface 30*es*2 may be a plane, for example. These two kinds of surfaces may be parallel to each other, for example. When the first front end surfaces 30*es*1 are planes, lens member 40E can be stably supported.

Correspondingly to the shape of the lens member 40E, the supporting member 30E is shaped so that the second front end surface 30*es*2 is set back from the first front end surfaces 30*es*1 in the rearward direction (i.e., in the −Z direction). Because of having this shape, the supporting member 30E includes two stepped portions 30*es*3. Each of the two stepped portions 30*es*3 is located between the corresponding one of the two first front end surfaces 30*es*1 and the second front end surface 30*es*2, and interconnects that first front end surface 30*es*1 and the second front end surface 30*es*2. The supporting member 30E also has two outer lateral surfaces 30*es*4 to be irradiated with the aforementioned laser light for heating purposes. Each of the stepped portions 30*es*3 and the outer lateral surfaces 30*es*4 may be a plane, for example.

The shape of the supporting member 30E differs from the shape of the supporting member 30A shown in FIG. 2A in the following three aspects. A first aspect is that the supporting member 30E has a shape corresponding to the supporting member 30A being turned upside down. A second aspect is that the dimension of the supporting member 30E along the X direction is greater than the dimension of the submount 10 along the X direction. A third aspect is that the rear end surface of the supporting member 30E is located rearward (i.e., in the −Z direction) of the rear end surface of the submount 10.

If the submount 10 shown in FIG. 2A and the submount 10 shown in FIG. 10 have substantially identical dimensions, then the dimension of the supporting member 30E along the X direction is greater than the dimension of the supporting member 30A shown in FIG. 2A along the X direction. Similarly, the dimension of the lens member 40E along the X direction is greater than the dimension of the lens member 40A shown in FIG. 2A along the X direction. Because the interval between the two first front end surfaces 30*es*1 is enlarged, it is easier to apply even loads to the two first front end surfaces 30*es*1 when pressurizing the lens member 40E against the supporting member 30E during the bonding of the supporting member 30E and the lens member 40E. Therefore, the supporting member 30E is able to support the lens member 40E more stably. Furthermore, because of the large dimensions of the supporting member 30E and the lens member 40E along the X direction, it is easier to finely adjust the position of the lens member 40E during the bonding of the supporting member 30E and the lens member 40E.

On the other hand, from the standpoint of transmitting the heat, which is emitted from the semiconductor laser element 20 during operation, to the stage 50*b*2 of the base 50*b* shown in FIG. 1B more efficiently, the laser light source 100A shown in FIG. 2A would be more advantageous than the laser light source 100E.

The positioning of the surfaces 30*es*1 to 30*es*4 of the supporting member 30E and the surfaces 40*es*1 to 40*es*4 of the lens member 40E is identical to the positioning of the surfaces 30*as*1 to 30*as*4 of the supporting member 30A and the surfaces 40*as*1 to 40*as*4 of the lens member 40A shown in FIG. 2A.

Thus, in Embodiment 5, too, a laser light source 100E can be realized in which none or little of the metal paste is adhering to the light incident surface 40*es*1 of the lens member 40E or to the light-exiting surface 20*e* of the semiconductor laser element 20.

Other Embodiments

Figure 11:
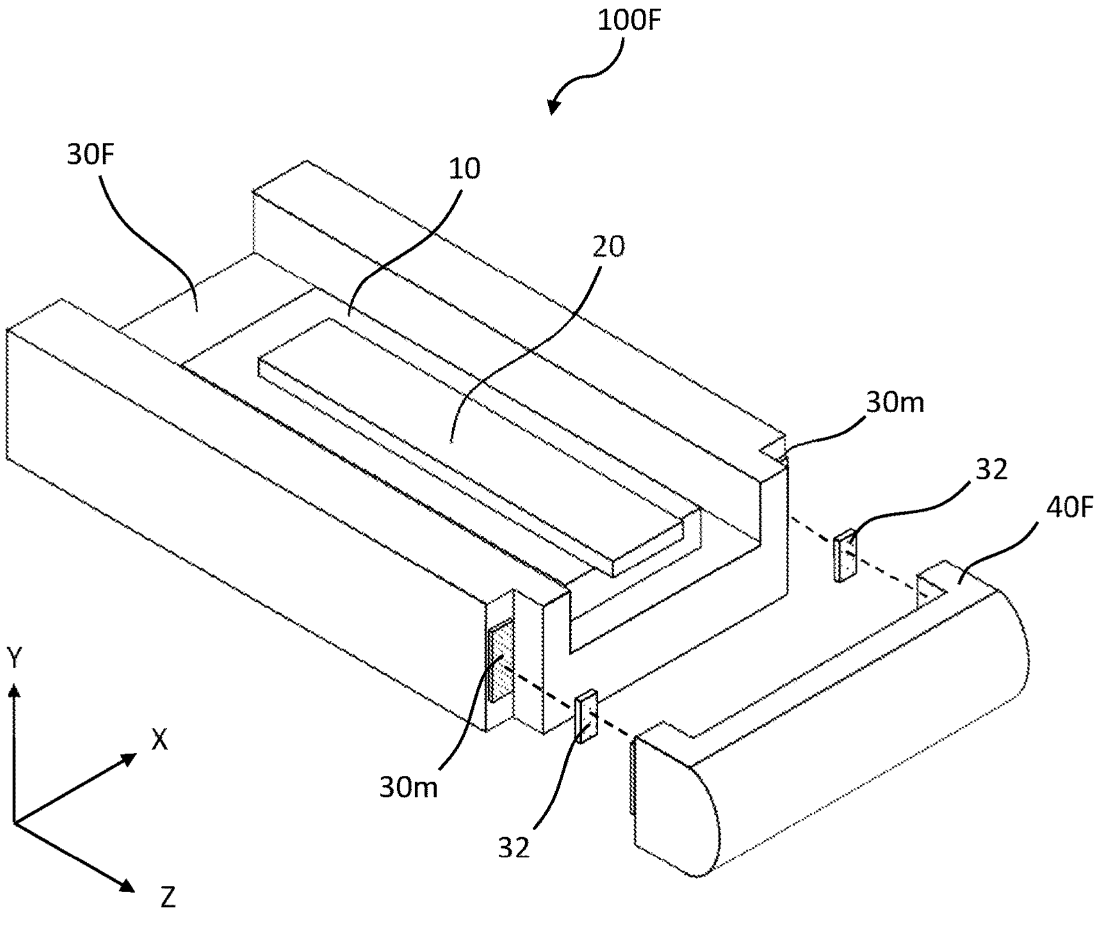
FIG. 11 is an exploded perspective view schematically showing the configuration of a laser light source according to illustrative Embodiment 6 of the present disclosure.
Figure 12:
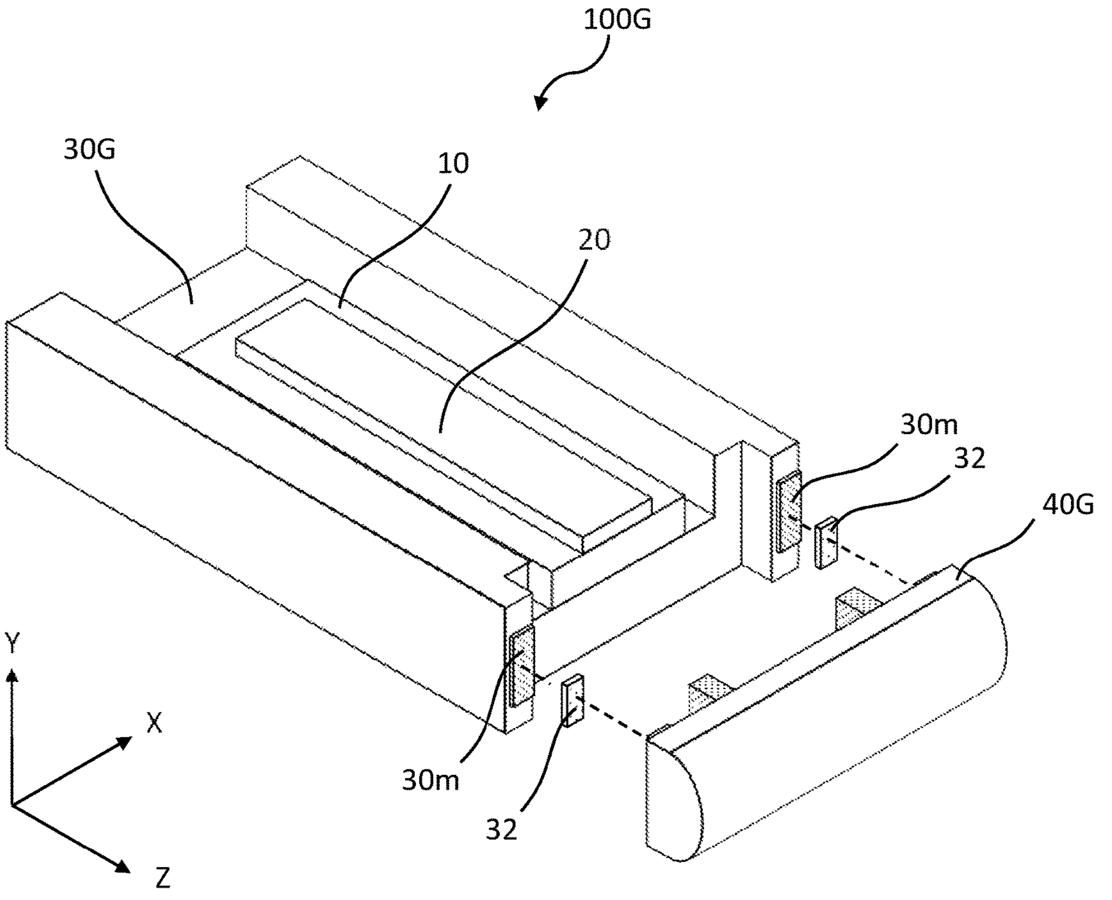
FIG. 12 is an exploded perspective view schematically showing the configuration of a laser light source according to illustrative Embodiment 7 of the present disclosure.

Next, with reference to FIG. 11 to FIG. 13, example configurations of laser light sources according to Embodiments 6 to 8 will be described. FIG. 11 to FIG. 13 are exploded perspective views schematically showing the configurations of laser light sources according to illustrative Embodiments 6 to 8 of the present disclosure, respectively. The laser light sources 100F to 100H shown in FIG. 11 to FIG. 13 differ from the laser light sources 100B to 100D shown in FIG. 5A, FIG. 7A and FIG. 8A in that, similarly to Embodiment 5, the supporting members 30F to 30H that respectively connect the lens members 40F to 40H with the submount 10 support not only the lens members 40F to 40H, respectively, but also the submount 10. The lens members 40F and 40H are similar in structure to the lens members 40B to 40D, respectively.

Just like the shape of the supporting member 30E differs from the shape of the supporting member 30A shown in FIG. 2A in the aforementioned three aspects, the shapes of the supporting members 30F to 30H also differ from the shapes of the supporting members 30B to 30D shown in FIG. 5A, FIG. 7A and FIG. 8A, respectively, in all of those three aspects.

Thus, in Embodiments 6 to 8, too, laser light sources 100F to 100H can be realized in which none or little of the metal paste is adhering to the light incident surfaces of the lens members 40F to 40H, respectively, or to the light-exiting surface 20*e* of the semiconductor laser element 20.

Embodiments 1 to 8 above and their modified examples may be employed in any arbitrary combination unless there is any contradiction.

Details of Each Component, e.g., Material and Dimensions

Next, details (e.g., materials and dimensions) of the submount 10, the semiconductor laser element 20, the supporting members 30A to 30H, the inorganic bonding layers 32, and the lens members 40A to 40H of the laser light sources 100A to 100H, the package 50 and the lead terminals 60 shown in FIG. 1A, and the first substrate 70*a*, the second substrate 70*b*, and the frame body 80 shown in FIG. 1C will be described.

<Submount 10>

A part or a whole of the submount 10 may be formed of at least one ceramic selected from the group consisting of AlN, SiC, and aluminum oxide, for example. Alternatively, a part or a whole of the submount 10 may be formed of at least one selected from the group consisting of: CuW; Cu; a multilayer structure of Cu/AlN/Cu; and a metal matrix compound (MMC), for example. The MMC may contain: at least one selected from the group consisting of Cu, Ag, or Al; and diamond, for example.

The submount 10 may have a thermal conductivity of e.g. not less than 10 W/m·K and not more than 800 W/m·K. With a thermal conductivity in this range, the submount 10 can efficiently transmit the heat emitted from the semiconductor laser element 20 during operation to the package 50.

The submount 10 may have a coefficient of thermal expansion of e.g. $2\times10^{-6}$ K$^{-1}$ and not more than $2\times10^{-5}$ K$^{-1}$. A coefficient of thermal expansion in this range can restrain the submount 10 from deforming because of the heat that is applied when bonding the semiconductor laser element 20 onto the submount 10 with an inorganic bonding member.

The submount 10 has a dimension along the X direction of e.g. not less than 1 mm and not more than 3 mm, a dimension along the Y direction of e.g. not less than 0.1 mm and not more than 0.5 mm, and a dimension along the Z direction of e.g. not less than 1 mm and not more than 6 mm.

Although not shown, the submount 10 includes a metal film provided on each of the upper surface 10*s*1 and the lower surface 10*s*2. The metal film on the upper surface 10*s*1 provides for an improved bonding strength when bonding the semiconductor laser element 20 to the submount 10 with an inorganic bonding member. The metal film on the upper surface 10*s*1 is also useful in supplying power to the semiconductor laser element 20. The metal film on the lower surface 10*s*2 provides for an improved bonding strength when bonding the submount 10 to the stage 50*b*2 of the base 50*b* shown in FIG. 1B with an inorganic bonding member. This metal film also provides for an improved thermal conductivity, and therefore is useful in allowing the heat emitted from the semiconductor laser element 20 during operation to be efficiently transmitted to the stage 50*b*2 via the submount 10.

Each of the metal films provided on the upper surface 10*s*1 and the lower surface 10*s*2 of the submount 10 may have a single layer or multiple layers, for example. A single-layered metal film may be formed of Cr or Au, for example. In the case of a multiple-layered metal film, an underlying layer may be formed of e.g. Cr, Ti, or Ni, an intermediate layer may be Pt, Pd, Rh, or Ru, and an outermost surface may be formed of e.g. Cr or Au. The dimension of the metal film along the Y direction may be e.g. not less than 0.5 μm and not more than 10 μm.

<Semiconductor Laser Element 20>

The semiconductor laser element 20 has a semiconductor multilayer structure that includes, along the Y direction: an n-type substrate, an n-type cladding layer, an active layer, and a p-type cladding layer. The n-type and the p-type may be inverted. The semiconductor laser element 20 further includes electrodes provided on an upper surface and a lower surface of the semiconductor multilayer structure. In the semiconductor multilayer structure, the electrode that is electrically connected to the p-type cladding layer is referred to as a "p-side electrode," whereas the electrode that is electrically connected to the n-type substrate is referred to as an "n-side electrode." By applying a voltage between the p-side electrode and the n-side electrode to flow an electric current of a threshold value or greater, the semiconductor laser element 20 emits laser light through the light-exiting surface 20*e*, which is one of the two end surfaces of the active layer that defines the front end surface. In the case in which an antireflection coating is provided on the front end surface, the surface of the antireflection coating may alternatively serve as the light-exiting surface 20*e*.

The semiconductor laser element 20 may be mounted in a so-called face-up state (in which the substrate is disposed closer to the submount 10 than the active layer in the semiconductor multilayer structure). Alternatively, the semiconductor laser element 20 may be mounted in a so-called face-down state (in which the active layer in the semiconductor multilayer structure is disposed closer to the submount 10 than the substrate). Irrespective of the wavelength of the laser light, a face-down mounting allows the heat emitted from the semiconductor laser element 20 during operation to be more efficiently transmitted to the submount 10 than does a face-up mounting. In the case of a face-down mounting, the semiconductor laser element 20 may be disposed on the submount 10 so that the light-exiting surface 20*e* of the semiconductor laser element 20 is located frontward (i.e., in the +Z direction) of the front end surface 10*s*3 of the submount 10. Such an arrangement can restrain the travel of a portion of laser light from being hindered by the submount 10. The distance between the light-exiting surface 20*e* of the semiconductor laser element 20 and the front end surface 10*s*3 of the submount 10 along the Z direction may be not less than 1 μm and not more than 40 μm, preferably not less than 1 μm and not more than 20 μm, for example. When the aforementioned distance is in this range, a contact area between the upper surface 10*s*1 of the submount 10 and the lower surface of the semiconductor laser element 20 is large enough, so that the heat emitted from the semiconductor laser element 20 during operation can be efficiently transmitted to the submount 10.

The semiconductor laser element 20 may emit laser light of violet, blue, green, or red in the visible light region, or infrared or ultraviolet laser light in the invisible region. The emission peak wavelength of violet light is preferably not less than 400 nm and not more than 420 nm, and more preferably not less than 400 nm and not more than 415 nm. The emission peak wavelength of blue light is preferably more than 420 nm but not more than 495 nm, and more preferably not less than 440 nm and not more than 475 nm. The emission peak wavelength of green light is preferably more than 495 nm but not more than 570 nm, and more preferably not less than 510 nm and not more than 550 nm. The emission peak wavelength of red light is not less than 605 nm and not more than 750 nm, and more preferably not less than 610 nm and not more than 700 nm.

Examples of a semiconductor laser element 20 that emits violet, blue, or green laser light include laser elements containing a nitride semiconductor material. Examples of nitride semiconductor materials include GaN, InGaN, and AlGaN. Examples of a semiconductor laser element 20 that emits red laser light include laser diodes containing an InAlGaP-based, GaInP-based, GaAs-based, or AlGaAs-based semiconductor material.

The semiconductor laser element 20 may have a dimension along the X direction of e.g. not less than 30 μm and not more than 500 μm, a dimension along the Y direction of e.g. not less than 20 μm and not more than 150 μm, and a dimension along the Z direction of e.g. not less than 50 μm and not more than 5 mm.

<Supporting Members 30A to 30H>

The supporting members 30A to 30H may be formed of at least one ceramic selected from the group consisting of AlN, SiC, aluminum oxide, and zirconium oxide, for example. Alternatively, the supporting members 30A to 30H may be at least one light-transmissive material selected from the group consisting of glass, silicone resins, quartz, synthetic quartz, sapphire, transparent ceramics, and plastics, for example. The supporting members 30A to 30H may be formed of at least one alloy selected from the group consisting of kovar and CuW, for example. Kovar is an alloy in which nickel and cobalt are added to iron, which is a main component. Alternatively, the supporting members 30A to 30H may be formed of Si, for example.

The largest dimension of the supporting members 30A to 30H along the X direction may be e.g. not less than 0.6 mm and not more than 3 mm; the largest dimension thereof along the Y direction may be e.g. not less than 0.1 mm and not more than 3 mm; and the largest dimension thereof along the Z direction may be e.g. not less than 0.2 mm and not more than 10 mm.

The metal films 30*m* provided on the first front end surfaces of the supporting members 30A to 30H may have a single layer or multiple layers as mentioned above, for example. The metal films 30*m* may have a dimension along the Z direction of e.g. not less than 0.3 μm and not more than 10 μm. The metal films 30*m* may be formed by vapor deposition or plating, for example.

Inorganic Bonding Layers 32

As described earlier, the inorganic bonding layers 32 are formed by heating an inorganic bonding member for bonding together the supporting members 30A to 30H and the lens members 40A to 40H. The inorganic bonding member may be a sinterable material such as the aforementioned metal paste, for example. The metal particles within the metal paste include at least one kind of metal particle selected from the group consisting of Ag particles, Cu particles, Au particles, and other precious metal particles, for example.

Alternatively, in the case in which there is no need for optical axis adjustment of the lens members 40A to 40H, the inorganic bonding member may be a solder material or a brazing material, for example. In soldering or brazing, a solder material or a brazing material is melted as its temperature is increased, and solidified as its temperature is decreased, whereby members are bonded to each other. The solder material may be at least one selected from the group consisting of AuSn, SnCu, SnAg, and SnAgCu, for example. The brazing material may be at least one selected from the group consisting of gold brazing materials, tin brazing materials, and silver brazing materials, for example.

The inorganic bonding member may have a thickness of e.g. not less than 1 μm and not more than 30 μm. With an inorganic bonding member having such a thickness, the bonding strength can be improved, and the bonding can be finished in a short time.

The inorganic bonding member used for bonding the submount 10 and the semiconductor laser element 20, bonding the submount 10 and any of the supporting members 30A to 30H, and bonding the submount 10 and the stage 50*b*2 of the base 50*b* may be any of the aforementioned sinterable materials, solder materials, or brazing material, for example.

Lens Members 40A to 40H

The lens members 40A to 40H may be formed of at least one light-transmissive material selected from the group consisting of glass, silicon, quartz, synthetic quartz, sapphire, transparent ceramics, and plastics, for example. However, the walls 40*cw* of the lens member 40C may be formed of at least one ceramic selected from the group consisting of silica, alumina, magnesia, zirconia, aluminum nitride, and silicon nitride, or at least one metal selected from the group consisting of Ag, Cu, and Au, for example. The lens members 40A to 40H have a transmittance of 60% or more, preferably 90% or more, and more preferably 95% or more with respect to the laser light emitted from the semiconductor laser element 20.

The largest dimension of the lens members 40A to 40H along the X direction may be equal to the largest dimension of the supporting members 30A to 30H along the X direction, or greater or smaller than the largest dimension of the supporting members 30A to 30H along the X direction, for example. However, the dimension of the lens members 40A to 40H along the X direction is greater than the shortest distance between the two support portions of the supporting members 30A to 30H along the X direction. The largest dimension of the lens members 40A to 40H along the Y direction may be e.g. not less than 0.2 mm and not more than 3 mm, and the largest dimension along the Z direction may be e.g. not less than 0.2 mm and not more than 3 mm.

The material of the metal films 40*m* provided on the bonding surfaces of the lens members 40A to 40H may include a single layer or multiple layers as mentioned above.

The metal films 40_m_ may have a dimension along the Z direction of e.g. not less than 0.3 μm and not more than 10 μm. The metal films 40_m_ may be formed by vapor deposition or plating, for example.

Package 50

Regarding the base 50_b_ of the package 50, the bottom plate 50_b_1 may be formed of at least one metal selected from the group consisting of Cu, Al, Ag, Fe, Ni, Mo, Cu, and W, for example. Examples of such metals includes alloys, e.g., CuMo. The bottom plate 50_b_1 being formed of such metals has a high thermal conductivity, and therefore is able to efficiently transmit the heat emitted from the semiconductor laser element 20 during operation to the outside. Regarding the base 50_b_ of the package 50, the lateral walls 50_b_3 surround the submount 10, the semiconductor laser element 20, the supporting members 30A to 30H, and the lens members 40A to 40H. The lateral walls 50_b_3 may be formed of kovar, for example.

The stage 50_b_2 provided on the bottom plate 50_b_1 of the base 50_b_ allows the light-exiting surface 20_e_ of the semiconductor laser element 20 and the light transmissive window 50_w_ to be aligned in height. The stage 50_b_2 may be formed of the same material as the bottom plate 50_b_1 of the base 50_b_, for example. The stage 50_b_2 may be a protruding portion of the bottom plate 50_b_1 of the base 50_b_, for example.

The cover 50L included in the package 50 may be formed of the same material as, or a different material from, any of the bottom plate 50_b_1, the stage 50_b_2, and the lateral walls 50_b_3 included in the base 50_b_. The light transmissive window 50_w_ included in the package 50 may be formed of at least one light-transmissive material selected from the group consisting of glass, quartz, synthetic quartz, sapphire, and light-transmissive ceramics, for example.

Lead Terminals 60

The two lead terminals 60 allow an electric current to flow in the semiconductor laser element 20. As shown in FIG. 1B, the two lead terminals 60 are electrically connected to the semiconductor laser element 20 via the wires 60_w_ and the submount 10. In the example shown in FIG. 1B, one of the lead terminals 60 is electrically connected to a metal film (electrode) provided on the upper surface of the semiconductor laser element 20 via three wires 60_w_. The other lead terminal 60 is electrically connected to the metal film provided on the upper surface 10_s_1 of the submount 10 via another three wires 60_w_. The number of wires 60_w_ electrically connecting each lead terminal 60 and the semiconductor laser element 20 does not need to be three, but may be one or two, or four or greater.

The lead terminals 60 may be formed of an electrically conductive material such as an Fe—Ni alloy or a Cu alloy, for example. The wires 60_w_ may be formed of at least one metal selected from the group consisting of Au, Ag, Cu, and Al, for example.

<First Substrate 70_a_ and Second Substrate 70_b_>

Each of the first substrate 70_a_ and the second substrate 70_b_ may be formed of the same material as the submount 10, for example. Alternatively, each of the first substrate 70_a_ and the second substrate 70_b_ may be at least one metal selected from the group consisting of Cu, Ag, and Al, for example. Each of the two interconnects 72 inside the first substrate 70_a_ may be formed of at least one metal selected from the group consisting of Au, Ag, Cu, and Al, for example. However, in the case in which the first substrate 70_a_ is formed of a metal, the interconnect 72 and other portions of the first substrate 70_a_ are to be electrically insulated from each other so that they do not conduct with each other.

Frame Body 80

The light-transmitting portion 80_a_ of the frame body 80 may be formed of at least one light-transmissive material selected from the group consisting of glass, quartz, synthetic quartz, sapphire, and light-transmissive ceramics, for example. Portions of the frame body 80 other than the light-transmitting portion 80_a_ may be formed of the same material as the light-transmitting portion 80_a_, silicon, or the same material as the submount 10.

Laser light sources and methods of manufacturing the same according to the present disclosure are applicable to light sources for use in processing applications, projectors, displays, or lighting devices, for example.

What is claimed is:

1. A laser light source comprising:
- a submount;
- a semiconductor laser element fixed to an uppermost surface of the submount, the semiconductor laser element having a light-exiting surface through which laser light is to be emitted;
- a lens member having a light incident surface on which the laser light is incident, and a bonding surface;
- a supporting member fixed to the uppermost surface of the submount and connecting the lens member and the submount together so that the light incident surface of the lens member faces the light-exiting surface of the semiconductor laser element; and
- an inorganic bonding layer bonding the bonding surface of the lens member and the supporting member together; wherein:
- between the light incident surface and the bonding surface, the lens member has a surface extending in a direction intersecting the light incident surface and the bonding surface; and
- a plane parallel to the upper surface of the submount passes through a part of the incident surface of the lens member on which the laser light is incident and a part of the inorganic bonding layer.

2. The laser light source of claim 1, wherein each of the light incident surface of the lens member and the bonding surface is substantially planar.

3. The laser light source of claim 1, wherein the lens member includes a stepped portion or a wall between the light incident surface and the bonding surface.

4. The laser light source of claim 3, wherein:
- the lens member is shaped so that the light incident surface protrudes or is set back from the bonding surface; and
- the stepped portion interconnects the light incident surface and the bonding surface.

5. The laser light source of claim 4, wherein the stepped portion has a height of not less than 10 μm and not more than 1 mm.

6. The laser light source of claim 4, wherein:
- the lens member is shaped so that the light incident surface is set back from the bonding surface; and
- the light-exiting surface of the semiconductor laser element is located frontward of the bonding surface of the lens member.

7. The laser light source of claim 4, wherein:
- the lens member is shaped so that the light incident surface protrudes from the bonding surface; and
- an interspace exists between a protruding portion of the lens member and the supporting member.

8. The laser light source of claim 4, wherein:
- the lens member is shaped so that the light incident surface protrudes from the bonding surface; and the light-exiting surface of the semiconductor laser element is located on a same plane as a facing surface of the supporting member that faces the light incident surface, or is located rearward of the facing surface of the supporting member.

9. The laser light source of claim 3, wherein:

the lens member includes the wall located between the light incident surface and the bonding surface; and the wall of the lens member is formed of a ceramic or a metal.

10. The laser light source of claim 9, wherein:

the wall has a height of not less than 10 μm and not more than 1 mm; and the wall has a width of not less than 50 μm and not more than 500 μm.

11. The laser light source of claim 9, wherein:

the wall has a protruding surface, the protruding surface protruding from the light incident surface and the bonding surface; and the light-exiting surface of the semiconductor laser element is located frontward of the protruding surface of the wall.

12. The laser light source of claim 9, wherein an interspace exists between the wall of the lens member and the supporting member.

13. The laser light source of claim 1, further comprising a package in which the semiconductor laser element is sealed.

14. A method of manufacturing a laser light source, comprising:

providing a semiconductor laser element and a submount, wherein the semiconductor laser element is configured to emit laser light, and the submount is a member to which a lens support member is connected;

providing a lens member having a light incident surface on which the laser light is incident, and a bonding surface that extends laterally with respect to the light incident surface, wherein the lens member has, in between the light incident surface and the bonding surface, a surface that extends in a direction intersecting each of the light incident surface and the bonding surface;

bringing into contact the bonding surface of the lens member and a surface of the lens support member at which the lens member is supported, via a metal paste containing an organic binder and metal particles dispersed in the organic binder; and bonding the lens member and the lens support member together by heating the metal paste by irradiating the lens support member with the laser light for heating purposes to sinter the metal particles.

15. The method of manufacturing a laser light source of claim 14, further comprising:

between the step of bringing into contact the bonding surface of the lens member and the surface of the lens support member via the metal paste and the step of bonding the lens member and the lens support member together, performing an optical axis adjustment for the lens member while the semiconductor laser element emits the laser light.

16. A laser light source comprising:

a submount;

a semiconductor laser element fixed to the submount, the semiconductor laser element having a light-exiting surface through which laser light is to be emitted;

a lens member having a light incident surface on which the laser light is incident, and a bonding surface that extends laterally with respect to the light incident surface;

a supporting member connecting the lens member and the submount together so that the light incident surface of the lens member faces the light-exiting surface of the semiconductor laser element; and an inorganic bonding layer bonding the bonding surface of the lens member and the supporting member together; wherein:

the lens member includes the wall located between the light incident surface and the bonding surface; and the wall of the lens member is formed of a ceramic or a metal.

* * * * *